United States Patent [19]

Hidaka

[11] Patent Number: 5,668,755
[45] Date of Patent: Sep. 16, 1997

[54] SEMICONDUCTOR MEMORY DEVICE HAVING WELL REGION

[75] Inventor: Hideto Hidaka, Hyogo, Japan

[73] Assignee: Mitsubishi Denki Kabushiki Kaisha, Tokyo, Japan

[21] Appl. No.: 637,907

[22] Filed: Apr. 25, 1996

[30]   Foreign Application Priority Data

Jun. 9, 1995 [JP] Japan ................................ 7-142933
Nov. 6, 1995 [JP] Japan ................................ 7-287487

[51] Int. Cl.$^6$ ........................................................ Q11C 13/00
[52] U.S. Cl. ........................................... 365/182; 365/181
[58] Field of Search ........................... 365/182, 181, 365/185, 189.01

[56]           References Cited

U.S. PATENT DOCUMENTS 5,055,897  10/1991  Canepa ............................... 365/185
5,281,842   1/1994  Yasuda et al. .

FOREIGN PATENT DOCUMENTS 64-15965    1/1989   Japan .
2-231760   10/1990   Japan .
3-142873    6/1991   Japan .
4-335570   11/1992   Japan .
4-350966   12/1992   Japan .
6-85200     3/1994   Japan .

OTHER PUBLICATIONS

1989 IEEE International Solid–State Circuits Conference Digest of Technical Papers, pp. 248–249.

Primary Examiner—Terrell W. Fears
Attorney, Agent, or Firm—Lowe, Price, LeBlanc & Becker

[57]           ABSTRACT

A semiconductor memory device is obtained having a triple well structure improved by preventing latch up or the like. In this semiconductor memory device, a substrate potential is applied to a p type well region in a memory cell region through a p$^+$ type impurity region and a ground potential is applied to a p type well region in a peripheral circuit region through the P$^+$ type impurity region. By this structure, the peripheral circuit region including a complementary type field effect transistor having the possibility of generation of latch up is kept at a stable potential even at the time of power-on. Further, since the substrate potential generated by internal circuitry is applied to a first well region of the memory cell region, reliable operation of the memory cell region is maintained.

16 Claims, 36 Drawing Sheets

SEMICONDUCTOR MEMORY DEVICE HAVING WELL REGION

BACKGROUND OF THE INVENTION

1. Field of the Invention

The present invention relates to semiconductor memory devices, and more particularly, to a structure of well regions provided in the surface of a semiconductor substrate.

2. Description of the Background Art

FIG. 53 is a sectional view showing a conventional semiconductor memory device having a peripheral circuit region and a memory cell region. Referring to FIG. 53, n type wells 103 and 105 are formed on the main surface of a p type semiconductor substrate 101 with a predetermined space. A p type MOS field effect transistor (hereinafter referred to as an "FET") is formed in a predetermined region on the main surface of n type well 103. The p type MOSFET is formed in a predetermined region on the main surface of n type well 105. On the other hand, an n type MOSFET is formed on the main surface of semiconductor substrate 101 between n type wells 103 and 105. The above described two p type MOSFETs and one n type MOSFET constitute the peripheral circuit region.

Further, the n type MOSFET is directly formed in a predetermined region on the main surface of semiconductor substrate 101 at a position separated from the peripheral circuit region by an element isolation insulating film 107. A trench type capacitor is formed so as to be connected to one source/drain region of the n type MOSFET. The n type MOSFET and the trench type capacitor constitute the memory cell region.

Semiconductor substrate 101 and n type wells 103 and 105 are provided with impurity regions 101a, 103a, and 105a for potential fixation, respectively.

Further, element isolation insulating films 109, 111, 113, 115, and 117 are formed in necessary regions on the main surface of semiconductor substrate 101.

It is preferable in general for a transistor not to have a backgate bias applied for higher speed operation. However, depending on where it is formed, it is sometimes better for a transistor such as one formed in a memory cell portion of a dynamic random access memory (hereinafter referred to as a "DRAM") to have a backgate bias applied in order to prevent a soft error and improve an element isolation breakdown voltage. Therefore, it is the most desirable to apply the most suitable backgate biases to respective transistors.

With regard to this, in the above described conventional semiconductor memory device shown in FIG. 53, the backgate biases of respective transistors 131, 133, and 135 are all fixed at the same value by a voltage of semiconductor substrate 101. Therefore, in the conventional semiconductor memory device, it is difficult to apply the most suitable backgate biases to respective transistors.

Further, in the conventional semiconductor memory device, such a problem as a latch up phenomenon and a soft error occurs with miniaturization of elements.

Further, the conventional semiconductor memory device also has a problem as to the characteristics of an input protecting circuit with increase of performance.

As described above, in the conventional semiconductor memory device, it is difficult to apply the most suitable backgate biases independently to respective transistors.

Although it is desired to apply a substrate potential (hereinafter referred to as a "VBB") generated by internal circuitry to the memory cell portion, application of VBB also to a complementary field effect transistor (hereinafter referred to as a "CMOSFET") portion causes generation of latch up.

In a bulk CMOS structure, a parasitic thyristor element is rendered conductive to cause a large current to flow between power supply terminals of the CMOS circuit, whereby the circuit operation is hampered and the IC in itself is destroyed. This phenomenon is generally called latch up. FIG. 54 shows a parasitic thyristor structure of a bulk CMOS IC having an n well structure. If a voltage lower than Vss is applied to an $n^+$ drain 1302 in such a structure, for example and electrons are injected from $n^+$ region 1302 to a p type substrate 1300, some of the electrons are collected in an n well 1303 (the collector of a lateral npn transistor Tnpn) to reach an $n^+$ region 1304 through n well 1303. This current is to flow through a resistor 1305 of n well 1303 in FIG. 54. If this current is sufficiently large and a pn junction on the source side of a pMOS transistor is forward biased by a voltage drop caused by resistor 1305, a vertical pnp transistor 1306 is rendered conductive, causing a collector current generated by holes to flow in p type substrate 1300. If this current is large enough to cause a pn junction on the source side of an nMOS transistor to be forward biased by a voltage drop caused by a resistor 1309, a lateral npn transistor is now rendered conductive. Such a collector current renders pnp transistor 1306 conductive more strongly. With a positive feedback formed as described above, a large current remains supplied between Vcc and Vss independent of the current from the $n^+$ drain which served as an initial trigger. In order to exit from this state, it is necessary to cut a current (holding current) per se which flows in the parasitic thyristor. Since the characteristics of the parasitic thyristor tend to be improved as miniaturization of the CMOS IC, the latch up is a serious problem in higher integration of the CMOS IC.

More specifically, when substrate potential VBB generated by the internal circuitry is applied to the CMOSFET portion, VBB abruptly changes in rising of power supply potential Vcc at the time of power-on, as shown in FIG. 55. At this time, the latch up sometimes occurs.

A portion related to the CMOS circuit has a parasitic thyristor structure by mixture of p channel transistor regions and n channel transistor regions. Therefore, a so-called latch up phenomenon occurs as described above. In particular, when not a potential having a strong supplying capability such as an externally applied ground potential but substrate potential VBB generated by the internal circuitry is applied, change of VBB often causes generation of the latch up. More specifically, when substrate potential VBB generated by the internal circuity has not been decided yet at the time of power-on, the potential of a power supply line node abruptly rises in response to power-on. Through the coupling capacitance between the power supply line node and the substrate, the substrate potential increases. As a result, when the substrate potential attains a positive value, a junction between the p type substrate and the n type source/drain region is forward biased, causing the latch up.

Other than the latch up, the conventional semiconductor memory device suffers from generation of a soft error which becomes conspicuous as miniaturization of the elements, complication of the element isolation structure, and low performance of the input protecting circuit as improvement of the semiconductor memory device in performance.

SUMMARY OF THE INVENTION

One object of the present invention is to prevent generation of latch up in a semiconductor memory device.

Another object of the present invention is to substantially reduce generation of a soft error in a semiconductor memory device.

Still another object of the present invention is to improve characteristics of an input protecting circuit in a semiconductor memory device.

According to one aspect of the present invention, a semiconductor memory device having a memory cell region and a peripheral circuit region includes: a first well region; a memory cell field effect transistor; a second well region; a semiconductor region; a first field effect transistor; and a second field effect transistor. The first well region has a first conductivity type. The memory cell field effect transistor is formed in the surface of the first well region, and has a second conductivity type. The second well region has the second conductivity type. The semiconductor region has the first conductivity type. The first field effect transistor is formed in the surface of the second well region, and has the first conductivity type. The second field effect transistor is formed in the surface of the semiconductor region, and has the second conductivity type. The first field effect transistor and the second field effect transistor constitute a complementary field effect transistor. A substrate potential generated by internal circuitry is applied to the first well region of the memory cell region, and ground potential is applied to the semiconductor region of the peripheral circuit region.

By this structure, the peripheral circuit region including the complementary field effect transistor in which latch up may occur is kept at a stable potential even at the time of power-on. Further, since the substrate potential generated by the internal circuitry is applied to the first well region in the memory cell region, reliable operation of the memory cell region is maintained.

According to another aspect of the present invention, a semiconductor memory device having a memory cell region and a peripheral circuit region includes: a semiconductor substrate; a first well region; a memory cell field effect transistor; a second well region; a third well region; a fourth well region; a first field effect transistor; and a second field effect transistor. The semiconductor substrate has a main surface and a first conductivity type. The first well region is formed on the main surface of the semiconductor substrate, and has the first conductivity type. The memory cell field effect transistor is formed in the surface of the first well region, and has a second conductivity type. The second well region is formed in the main surface of the semiconductor substrate, and has the second conductivity type. The third well region is formed in the main surface of the semiconductor substrate, and has the first conductivity type. The fourth well region is formed so as to cover the third well region, and has the second conductivity type. The first field effect transistor is formed in the surface of the second well region, and has the first conductivity type. The second field effect transistor is formed in the third well region, and has the second conductivity type. The first field effect transistor and the second field effect transistor constitute a complementary field effect transistor. The second well region of the second conductivity type and the fourth well region of the second conductivity type are formed so as to be separated by the semiconductor substrate of the first conductivity type with a predetermined space.

In this semiconductor memory device, since the second well region of the second conductivity type in which the first field effect transistor is formed and the fourth well region of the second conductivity type in which the second field effect transistor is formed, these transistors constituting the complementary field effect transistor causing the latch up, are formed so as to be separated by the semiconductor substrate of the first conductivity type with a predetermined space, a parasitic transistor causing the latch up is less likely to be formed.

According to still another aspect of the present invention, a semiconductor memory device having a memory cell region and a peripheral circuit region includes: a semiconductor substrate; a first well region; a memory cell field effect transistor; a second well region; a first field effect transistor; and a second field effect transistor. The semiconductor substrate has a main surface and a first conductivity type. The first well region is formed on the main surface of the semiconductor substrate, and has the first conductivity type. The memory cell field effect transistor is formed in the surface of the first well region, and has a second conductivity type. The second well region is formed in the main surface of the semiconductor substrate, and has the second conductivity type. The first field effect transistor is formed in the surface of the second well region, and has the first conductivity type. The second field effect transistor is formed in the surface of the semiconductor substrate, and has the second conductivity type. The first field effect transistor and the second field effect transistor constitute a complementary field effect transistor. The second well region of the peripheral circuit region is connected to an internal power supply having a voltage obtained by decreasing a voltage of an external power supply by an internal power supply generator.

As a result, a stable potential is kept even at the time of power-on.

According to a further aspect of the present invention, a semiconductor memory device includes a semiconductor substrate, a first well region, a first source/drain region, and a first gate electrode. The semiconductor substrate has a main surface. The first well region is formed in a predetermined region of the main surface of the semiconductor substrate with a first depth from the main surface of the semiconductor substrate. The first well region has a first conductivity type. The first source/drain region is formed with a predetermined space so as to sandwich a first channel region in a predetermined region of the main surface of the first well region from the main surface of the first well region. The first source/drain region has a second conductivity type. The first gate electrode is formed on the first channel region with a first gate insulating film therebetween. The first depth of the first well region is smaller than a funneling length from the bottom surface of the first source/drain regions.

By this structure, a large part of electric charge generated by incidence of α particles from above does not reach the first source/drain region. Therefore, influence of the α particles becomes smaller.

According to a further aspect of the present invention, a semiconductor memory device includes: a semiconductor substrate; a first well region; a second well region; a first source/drain region; a first gate electrode; a second source/drain regions; a second gate electrode; and an element isolating film. The semiconductor substrate has a main surface. The first well region is formed in a predetermined region of the main surface of the semiconductor substrate with a first depth from the main surface of the semiconductor substrate. The first well region has a first conductivity type. The second well region is formed in a predetermined region of the main surface of the first well region with a second depth from the main surface of the first well region. The second well region has a second conductivity type. The first source/drain region is formed with a predetermined space so as to sandwich a first channel region in a predetermined region of the main surface of the second well region with a predetermined depth from the main surface of the second well region. The first source/drain region has the first conductivity type. The first gate electrode is formed on the first channel region with a first gate insulating film therebetween. The second source/drain region is formed with a predetermined space so as to sandwich a second channel region in a predetermined region of the main surface of the semiconductor substrate with a predetermined depth from the main surface of the semiconductor substrate. The second source/drain region has the first conductivity type. The second gate electrode is formed on the second channel region with a second gate insulating film therebetween. The element isolating film is formed on the main surface of the semiconductor substrate, the first well region, and the second well region, which are positioned between the first source/drain regions and the second source/drain regions.

By this structure, isolation between the respective wells and between the wells and the semiconductor substrate are implemented reliably and an isolation portion is structured simply.

According to a further aspect of the present invention, a semiconductor substrate includes a semiconductor substrate, a first well region, a second well region, an element isolating film, a first conductive region, and a second conductive region. The semiconductor substrate has a main surface. The first well region is formed in a predetermined region of the main surface of the semiconductor substrate with a first depth from the main surface of the semiconductor substrate. The first well region has a second conductivity type. The second well region is formed in a predetermined region of the main surface of the first well region with a second depth from the main surface of the first well region. The second well region has a first conductivity type. The element isolating film is formed on the main surface of the semiconductor substrate, the first well region, and the second well region, and has first and second openings on the first and second well regions, respectively. The first conductive region is formed in the surface of the first well region positioned at the first opening. The second conductive region is formed in the surface of the second well region positioned at the second opening.

As a result, the structure of an input protecting circuit is simplified.

According to a further aspect of the present invention, a semiconductor memory device includes an input protecting circuit. The input protecting circuit includes a semiconductor substrate of a first conductivity type having a main surface, a first impurity region of the first conductivity type, a first well region of the first conductivity type, and a second well region of a second conductivity type. The first impurity region is formed in the main surface of the semiconductor substrate. The first well region is formed in the main surface of the semiconductor substrate so as to be electrically connected to the first impurity region and to have a depth larger than that of the first impurity region. The second well region is formed in the main surface of the semiconductor substrate so as to cover the first well region. In the above structure, the impurity concentration of the first well region may be lower than that of the first impurity region. Further, in the above structure, the first well region may be formed so as to cover the first impurity region. Alternatively, in the above structure, the first well region may be formed so as to cover only part of the first impurity region. Further, in the above structure, at least one of first and second power supply potentials externally applied to the semiconductor memory device may be applied to the second well region. Alternatively, at least one of a potential equal to or higher than the higher one of the first and second power supply potentials externally applied to the semiconductor memory device and a potential equal to or lower than the lower one of the first and second power supply potentials externally applied to the semiconductor memory device may be applied to the second well region. Further, in the above structure, the first impurity region may constitute any of an external signal input node, an external power supply node, and an external signal output node. Further, in the above described structure, an element isolation region having a trench isolation structure may be formed in the main surface of the semiconductor substrate so as to sandwich the first impurity region. Alternatively, in the above described structure, the element isolation region of trench isolation may be formed in the main surface of the first well region so as to sandwich the first impurity region, and the first well region may be formed so as to cover the bottom surface and both side surfaces of the element isolation region.

In this semiconductor memory device, since the first well region of the first conductivity type is formed so as to be electrically connected to the first impurity region of the first conductivity type formed in the main surface of the semiconductor substrate and to have a depth larger than the first impurity region, and the second well region of the second conductivity type is formed so as to cover the first well region, a junction portion is formed at a deeper position due to the first well region. Therefore, unlike such a structure as described not having the first well region, even when a large current flows in the direction of the substrate from the first impurity region, destruction of the junction under a contact portion and formation of a leakage path to the substrate are prevented. Further, if the impurity concentration of the first well region is set lower than that of the first impurity region, the inclination of impurity distribution at the junction portion between the first well region and the second well region becomes gentle. Therefore, the leakage path to the substrate is less likely to be formed. Further, by forming the first well region so as to cover the bottom surface and both side surfaces of the element isolation region having a trench isolation structure, not only a vertical bipolar transistor but also a lateral bipolar transistor are constituted of the first well region, the second well region, and the semiconductor substrate even in the case of trench isolation. These transistors can function as a protecting circuit. As a result, the characteristics of the protecting circuit are improved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described hereinafter with reference to the drawings.

[First Embodiment]

Figure 1:
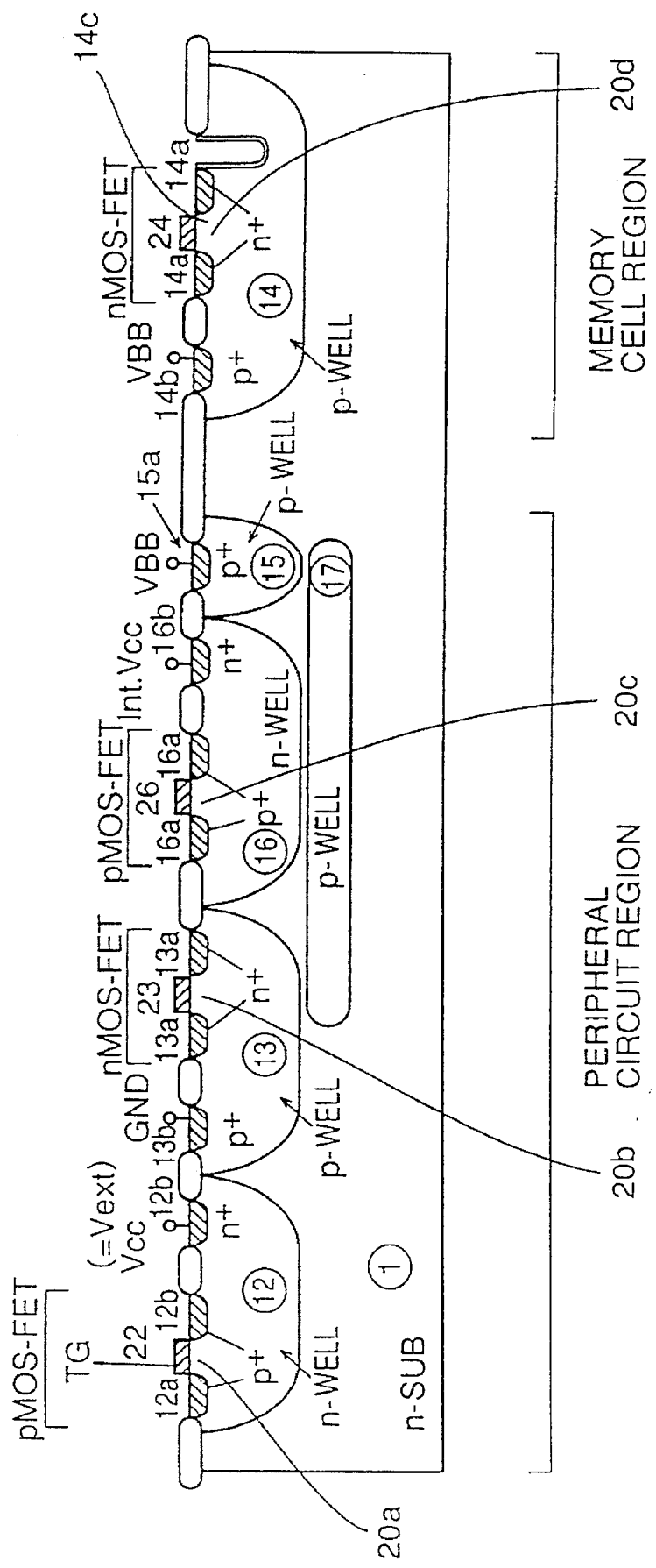
FIG. 1 is a sectional view showing a semiconductor memory device according to a first embodiment of the present invention.

Referring to FIG. 1, an n type MOS transistor $20d$ is formed in a memory cell region. A CMOS (Complementary MOS) transistor of an n type MOS transistor $20b$ and a p type MOS transistor $20c$ is formed in a peripheral circuit region.

More specifically, in the memory cell region, a p type well region 14 is formed in the main surface of a semiconductor substrate 1. A pair of n type source/drain regions $14a$ are formed in a predetermined region of the main surface of p type well region 14 with a predetermined space so as to sandwich a channel region $14c$. A gate electrode 24 is formed on channel region $14c$ with a gate insulating film therebetween. A $P^+$ type impurity region $14b$ for fixing the potential of p type well region 14 is formed in a predetermined region of the main surface of p type well region 14.

In the peripheral circuit region, three well regions are arranged linearly. More specifically, one p type well region 13 is sandwiched between two n type well regions 12 and 16. Further, a p type well region 15 for application of a backgate bias is formed adjacent to an n type well region $16b$. A p type well region 17 is formed in contact with the bottom surfaces of p type well region 13, n type well region 16, and p type well region 15.

Substrate potential VBB is applied to a $p^+$ type impurity region $15a$ of p type well region 15. Power supply potential Vext is applied to an $n^+$ type impurity region $12b$ of n type well region 12. Ground potential GND is applied to a $p^+$ type impurity region $13b$ of p type well region 13. An internal power supply potential Vint is applied to $n^+$ type impurity region $16b$ of n type well region 16. The Vint means a potential obtained by decreasing power supply potential Vext by an internal power supply generating circuit. Further, substrate potential VBB generated by internal circuitry is applied to a conductive region $14b$ of p type well region 14 in the memory cell region.

In a DRAM in general, substrate potential VBB generated by the internal circuitry must be applied to the memory cell region. Since substrate potential VBB generated by the internal circuitry is not necessarily applied to the peripheral circuit region having the possibility of generation of the above described latch up, however, ground potential GND, which is a more stable potential, can be applied to the peripheral circuit region.

Ground potential GND is stable even in an unsteady state having the larger possibility of latch up, that is, even at the time of power-on. By applying the ground potential to the peripheral circuit region, generation of latch up at the time of power-on can be prevented.

In view of this, in the first embodiment shown in FIG. 1, substrate potential VBB generated by the internal circuitry is applied to $p^+$ type impurity region $14b$ in the memory cell region. On the other hand, in the peripheral circuit region, ground potential GND is applied to p⁺ type impurity region 13b for prevention of latch up. Latch up generated in a CMOS structure in the peripheral circuit region can thus be prevented effectively with the function of the memory cell region similar to that of a conventional example maintained.

[Second Embodiment]

Figure 2:
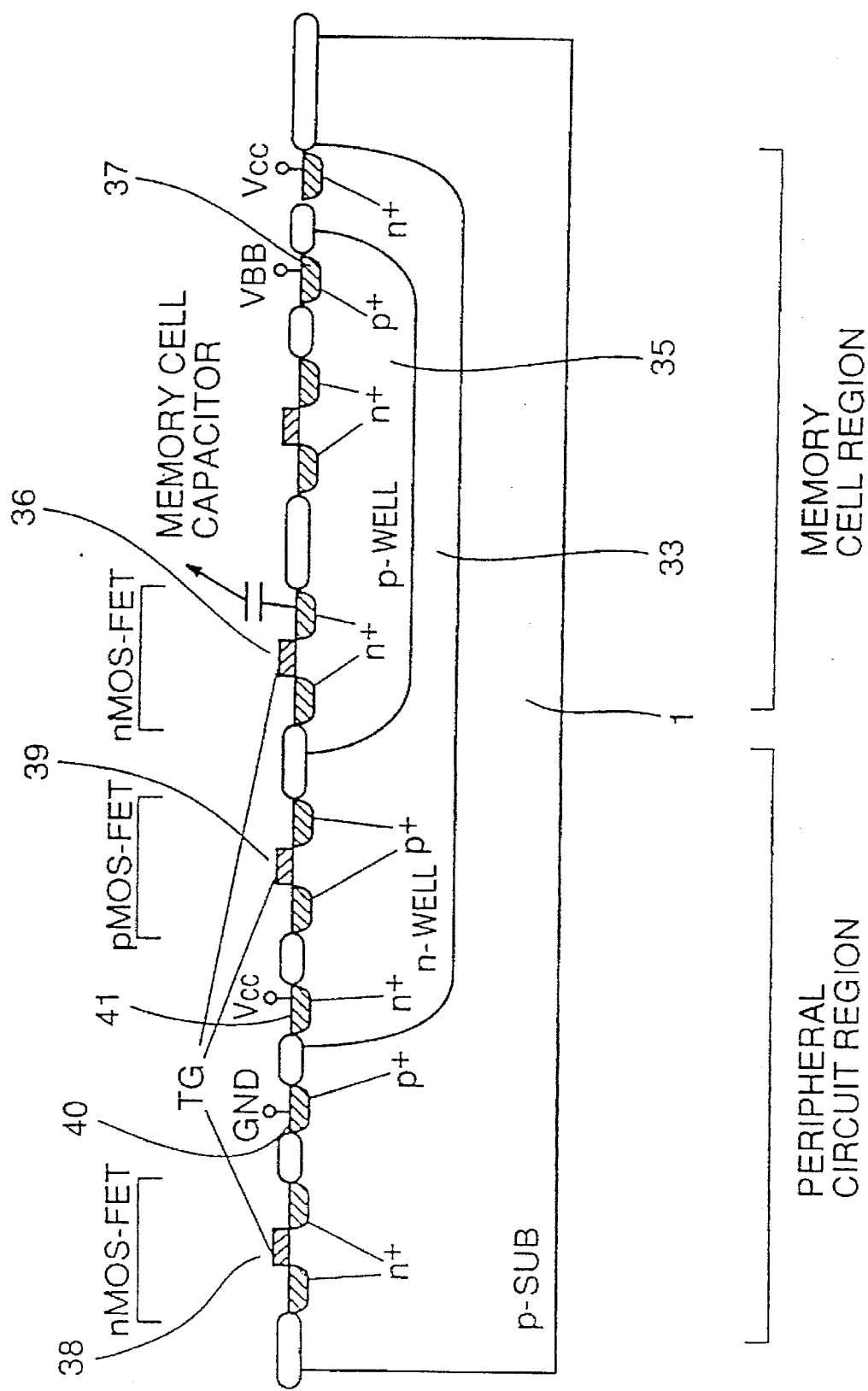
FIG. 2 is a sectional view showing a semiconductor memory device according to a second embodiment of the present invention.

Referring to FIG. 2, an n type MOS transistor 36 is formed in the memory cell region. A CMOS transistor formed of an n type MOS transistor 38 and a p type MOS transistor 39 is formed in the peripheral circuit region. More specifically, a p type well region 35 is formed in the main surface of semiconductor substrate 1 in the memory cell region. In the main surface of p type well region 35, n type MOSFET 36 is formed. A capacitor is connected to one source/drain region of n type MOSFET 36. A p⁺ type impurity region 37 for fixing the potential of p type well region 35 is formed in a p⁺ type impurity region 37, to which substrate potential VBB generated by the internal circuitry is applied.

On the other hand, in the peripheral circuit region, n type MOSFET 38 is formed in the main surface of semiconductor substrate 1. A p⁺ type impurity region 40 for fixing the potential of semiconductor substrate 1 is formed on the main surface of semiconductor substrate 1, to which the ground potential is applied. Further, an n type well region 33 is formed on the main surface of semiconductor substrate 1 so as to cover p type well region 35 in the memory cell region and to extend to the peripheral circuit region. On the main surface of n type well region 33, p type MOSFET 39 constituting the peripheral circuit region is formed. Further, an n⁺ type impurity region 41 for fixing the potential of n type well region 33 is formed on the main surface of n type well region 33.

In such a second embodiment shown in FIG. 2 as described above, since a CMOS structure of n type MOSFET 38 and p type MOSFET 39 is formed in the peripheral circuit region, there is the possibility of generation of latch up, as in the case of the first embodiment. In order to prevent this, substrate potential VBB generated by the internal circuitry is applied to p⁺ impurity region 37 in the memory cell region, and on the other hand, ground potential GND is applied to p⁺ type impurity region 40 in the peripheral circuit region. As a result, latch up can be prevented as in the case of the first embodiment.

Referring to FIGS. 3 to 9, a method of manufacturing the semiconductor memory device according to the second embodiment will be described.

Figure 3:
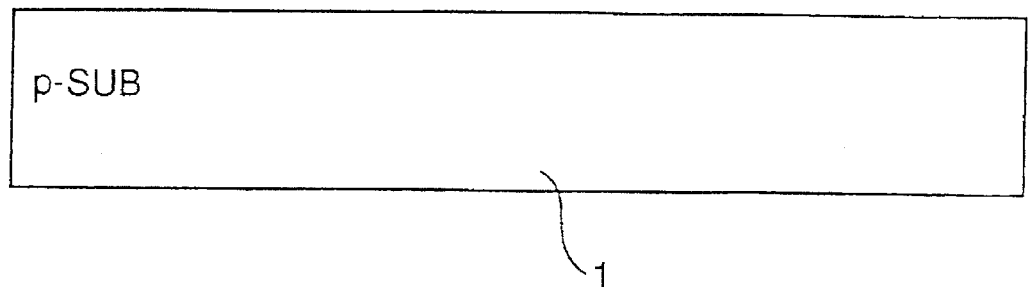
FIGS. 3 to 9 are sectional views of the semiconductor memory device of the second embodiment shown in FIG. 2 in the first to the seventh steps of the manufacturing process thereof.

FIG. 3 shows semiconductor substrate 1 for fabrication of the semiconductor memory device.

Figure 4:
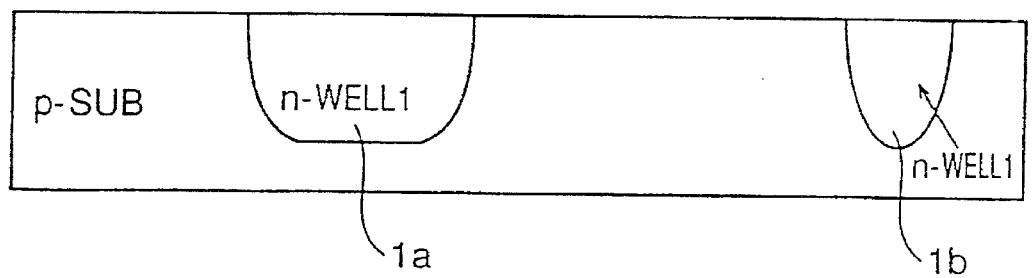

As shown in FIG. 4, by implantation of an n type impurity into a predetermined region on the main surface of semiconductor substrate 1, n type well regions 1a and 1b having a predetermined depth are formed.

Figure 5:
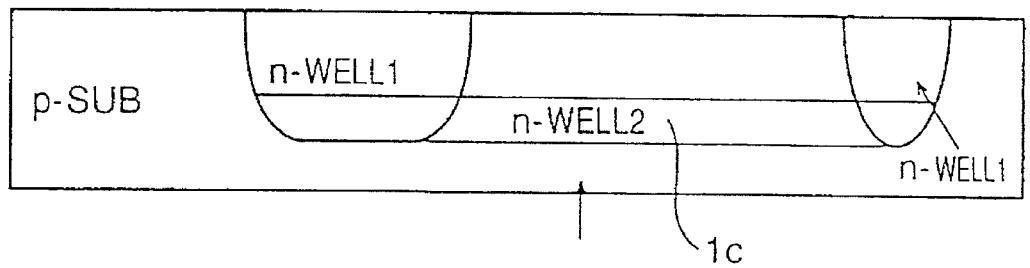

As shown in FIG. 5, by implantation of the n type impurity into a predetermined region of the main surface of semiconductor substrate 1, an n type well region 1c buried so as to connect n type well regions 1a and 1b is formed.

Figure 6:
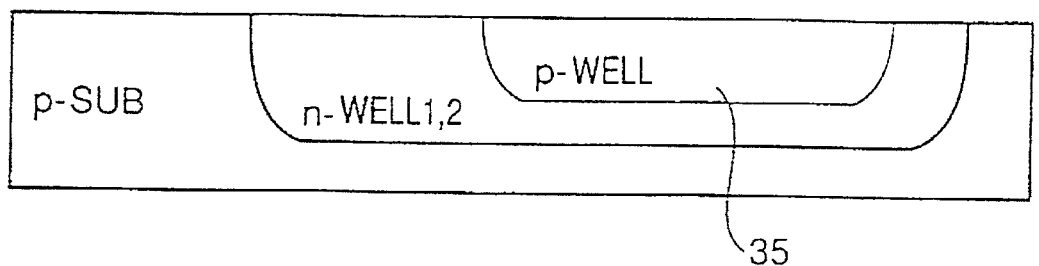

As shown in FIG. 6, by implanting a p type impurity into a region surrounded by these three n type well regions 1a, 1b, and 1c, p type well region 35 is formed.

Figure 7:
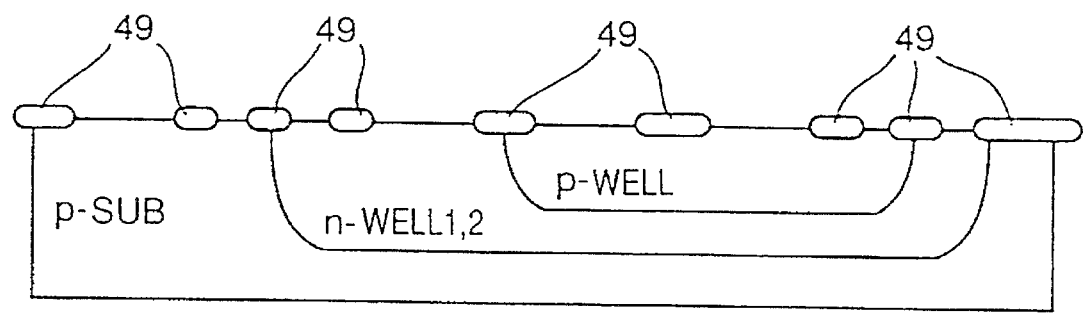

As shown in FIG. 7, an element isolation insulating film 49 is formed in a predetermined region on the main surface of semiconductor substrate 1 with an LOCOS (Local Oxidation of Silicon) method.

Figure 8:
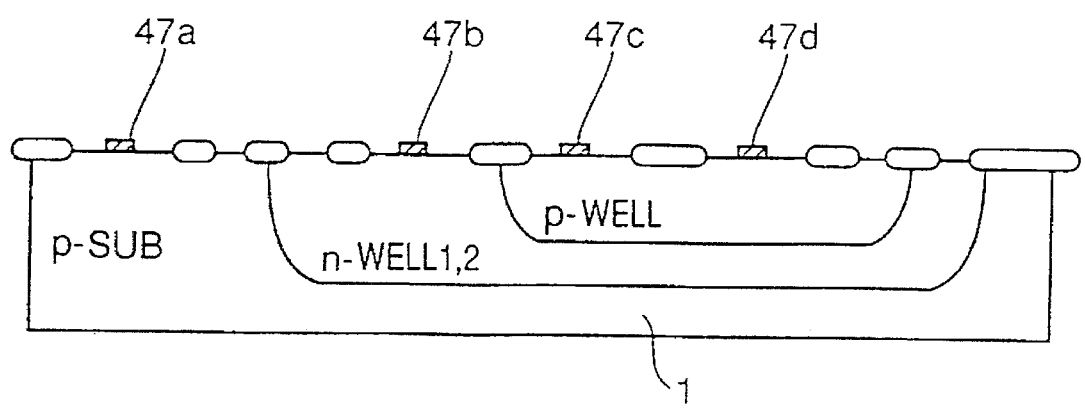

As shown in FIG. 8, gate electrodes 47a, 47b, 47c, and 47d are formed in a predetermined region on the main surface of semiconductor substrate 1 with a gate insulating film therebetween.

Figure 9:
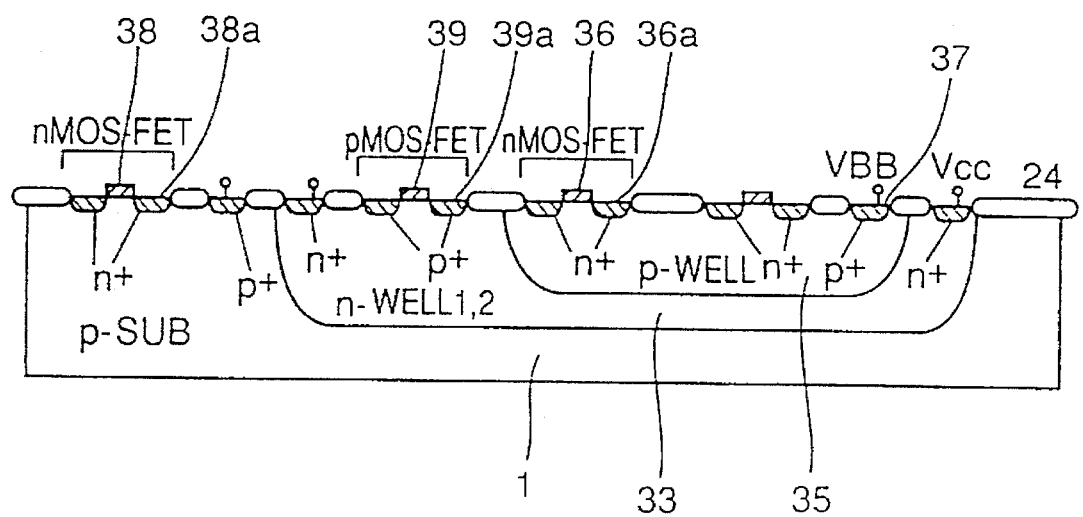

As shown in FIG. 9, by implanting an impurity with gate electrodes 47a, 47b, 47c, and 47d used as a mask, source/drain regions 36a, 39a, and 38a are formed. An impurity region 37 for fixing the potentials of the well regions is also formed.

The semiconductor memory device according to the second embodiment shown in FIG. 2 is thus completed.

[Third Embodiment]

Figure 10:
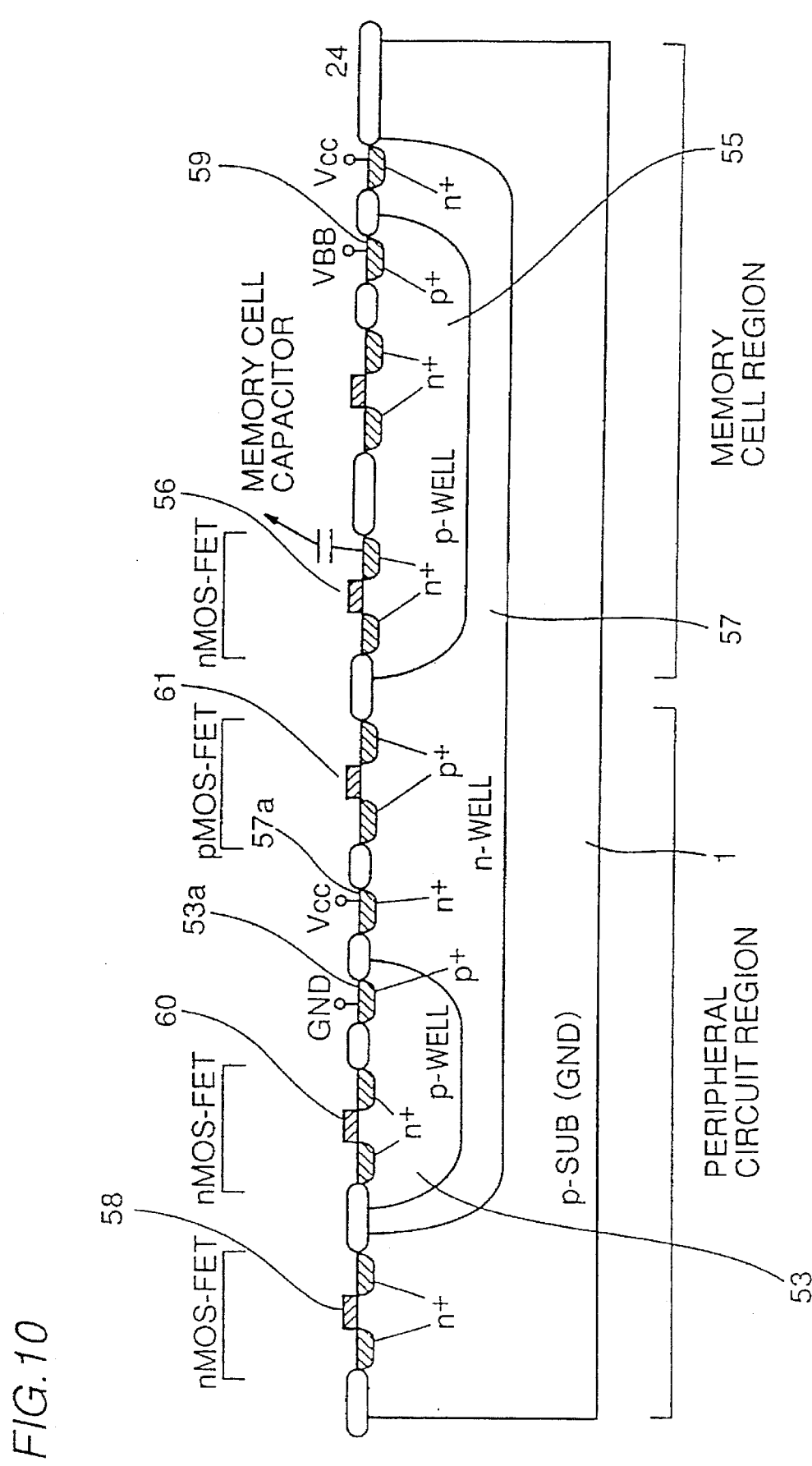
FIG. 10 is a sectional view showing a semiconductor memory device according to a third embodiment of the present invention.

Referring to FIG. 10, an n type MOS transistor 56 is formed in the memory cell region. On the other hand, a CMOS transistor of n type and p type MOS transistors 60 and 61 is formed in the peripheral circuit region.

More specifically, a p type well region 55 is formed in the main surface of semiconductor substrate 1 in the memory cell region. In the main surface of p type well region 55, n type MOSFET 56 is formed. A p⁺ type impurity region 59 for fixing the potential of p type well region 55 is formed, to which substrate potential VBB generated by the internal circuitry is applied.

On the other hand, n type MOSFET 58 is directly formed in the main surface of semiconductor substrate 1 in the peripheral circuit region. A p type well region 53 is formed in the main surface of semiconductor substrate 1. In the main surface of p type well region 53, n type MOSFET 60 is formed. A p⁺ type impurity region 53a for fixing the potential of p type well region 53 is formed, to which ground potential GND is applied.

An n type well region 57 is formed so as to cover both p type well regions 53 and 55. In the main surface of n type well region 57, p type MOSFET 61 is formed. An n⁺ type impurity region 57a for fixing the potential of n type well region 57 is formed, to which power supply potential Vcc is applied.

In the third embodiment shown in FIG. 10, the following effects can also be expected in addition to the effect of preventing latch up of the second embodiment. More specifically, a portion not included in the CMOS structure of the peripheral circuit region, which has no possibility of generation of latch up, can be formed in the surface portion of the semiconductor substrate, if necessary, to which substrate potential VBB generated by the internal circuitry is applied. Therefore, according to the third embodiment, different threshold voltages can be used easily, as compared to the case where ground potential GND is applied to the entire peripheral circuit region. In other words, electrical characteristic parameters of respective transistors can be optimized easily.

[Fourth Embodiment]

Figure 11:
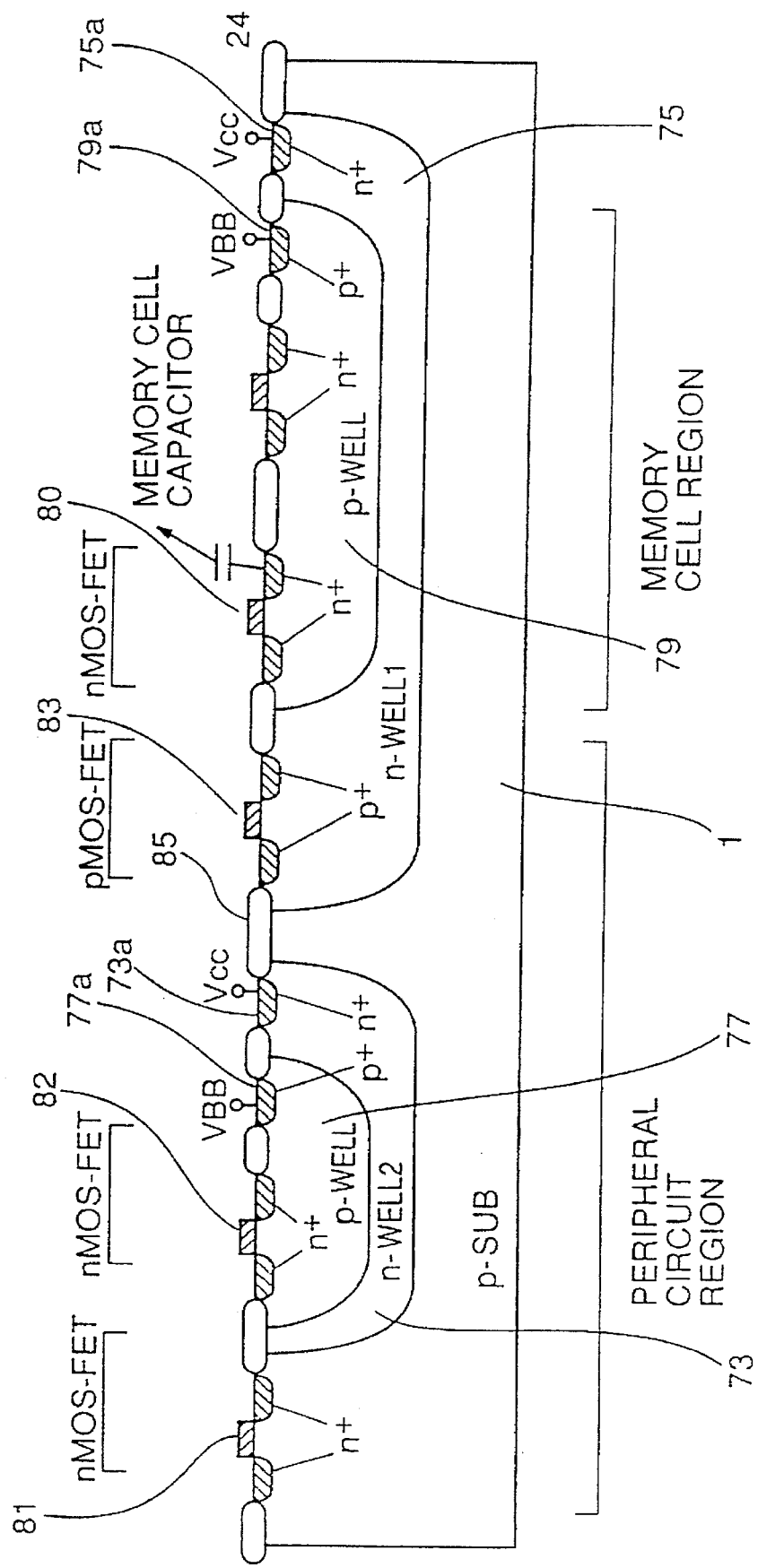
FIG. 11 is a sectional view showing a semiconductor memory device according to a fourth embodiment of the present invention.

Referring to FIG. 11, an n type MOS transistor 80 is formed in the memory cell region. On the other hand, a CMOS transistor of n type and p type MOS transistors 82 and 83 is formed in the peripheral circuit region.

More specifically, a p type well region 79 is formed in the main surface of semiconductor substrate 1 in the memory cell region. An n type MOSFET 80 is formed in the main surface of p type well region 79. A p⁺ type impurity region 79a for fixing the potential of p type well region 79 is formed, to which substrate potential VBB generated by the internal circuitry is applied.

On the other hand, an n type MOSFET 81 is directly formed in the main surface of semiconductor substrate 1 in the peripheral circuit region. A p type well region 77 is formed in the main surface of semiconductor substrate 1. In the main surface of p type well region 77, n type MOSFET 82 is formed. A p$^+$ type impurity region 77a for fixing the potential of p type well region 77 is formed, to which substrate potential VBB generated by the internal circuitry is applied. Further, an n type well region 75 is formed so as to cover p type well region 79. In the main surface of n type well region 75, p type MOSFET 83 is formed. An n$^+$ type impurity region 75a for fixing the potential of n type well region 75 is formed, to which power supply potential Vcc is applied.

An n type well region 73 is formed so as to cover p type well region 77. In the main surface of n type well region 73, an n$^+$ type impurity region 73a for fixing the potential of n type well region 73 is formed, to which power supply potential Vcc is applied.

In this structure, n type well regions 73 and 75 are isolated by an element isolation insulating film 85 formed on the main surface of semiconductor substrate 1 with the LOCOS method. Since these well regions are completely isolated by p type semiconductor substrate 1, they are not in direct contact with each other.

A parasitic transistor which would otherwise be formed by the CMOS structure of n type MOSFET 82 and p type MOSFET 83 is not structured in the peripheral circuit region. Since the parasitic transistor causes latch up, generation of latch up can be prevented.

Further, a parasitic transistor which could be formed of n type MOSFET 81 and p type MOSFET 83 does not cause latch up, because these MOSFETs are separated from each other with n type well region 73 therebetween and positioned distant from each other.

As described above, in the fourth embodiment shown in FIG. 11, there is no problem of generation of latch up. Therefore, as described above, substrate potential VBB generated by the internal circuitry can be applied to p type well region 77 constituting the peripheral circuit region.

Figure 12:
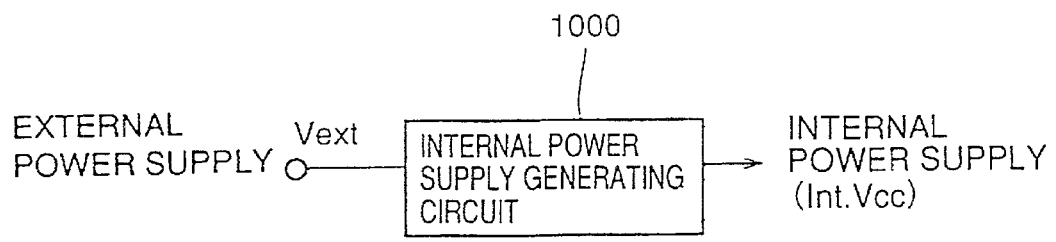
FIG. 12 is a concept diagram for describing an internal power supply used in fifth to eighth embodiments of the present invention.

Referring to FIG. 12, voltage Vext supplied by an external power supply is decreased by an internal power supply generating circuit 1000 to be supplied as an internal power supply voltage Int.Vcc.

Figure 13:
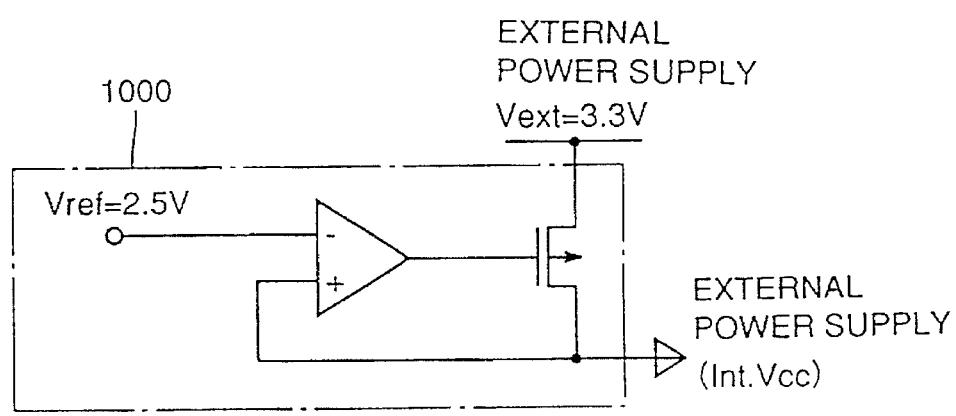
FIG. 13 is a circuit diagram showing an internal power supply generating circuit shown in FIG. 12 in detail.

Referring to FIG. 13, internal power supply generating circuit 1000 includes a comparing circuit (comparator). In this embodiment, voltage Vext supplied by the external power supply is 3.3 V, for example, and a reference voltage Vref is 2.5 V. By using such a comparing circuit, it is possible to decrease voltage Vext to supply the resultant voltage as internal power supply voltage Int. Vcc.

Figure 14:
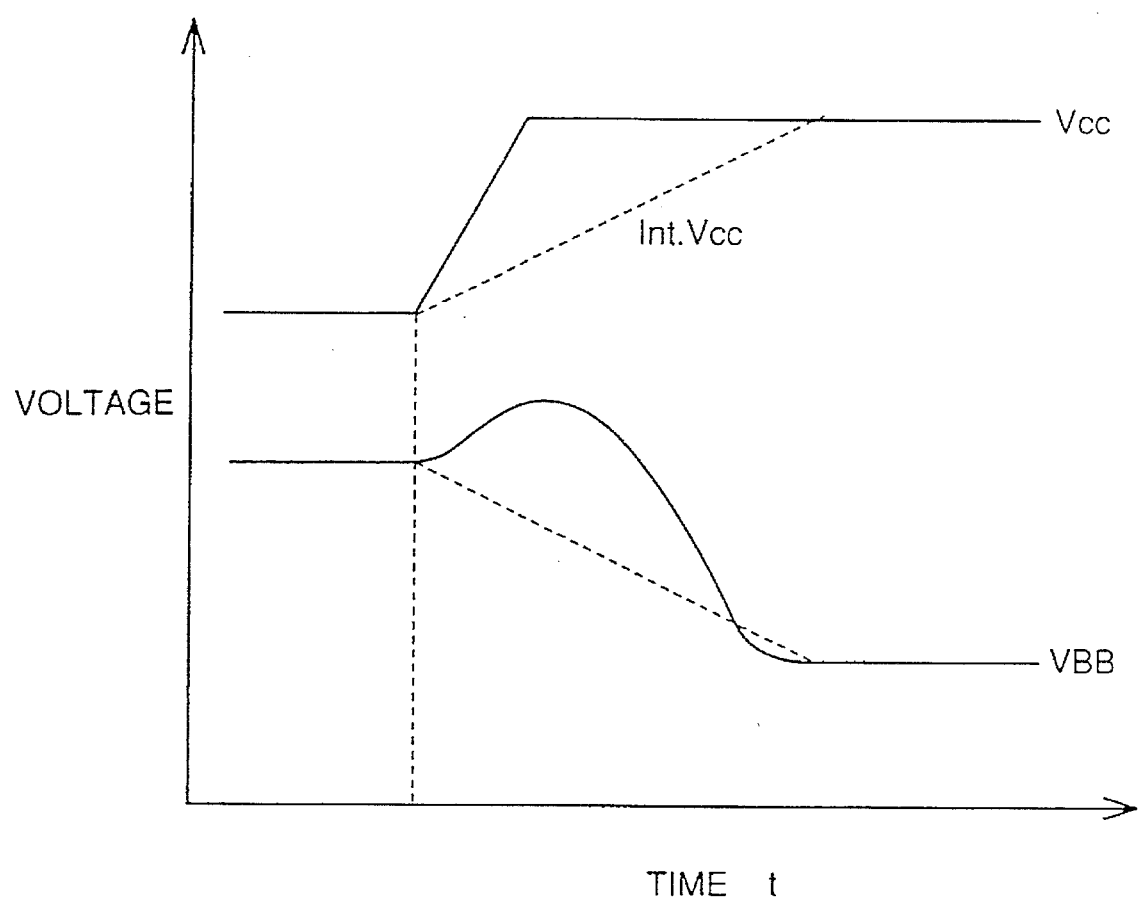
FIG. 14 is a diagram showing change of an internal power supply potential.

As shown by the dotted line in FIG. 14, internal power supply potential Int. Vcc is stable from the time of power-on until it is brought to a steady state. Therefore, as compared to the case where substrate potential VBB generated by the internal circuitry, which fluctuates severely, is applied, generation of latch up is decreased to such an extent that the generation of latch up does not become a problem for the device in the case of application of internal power supply potential Int. Vcc.

[Fifth Embodiment]

Figure 15:
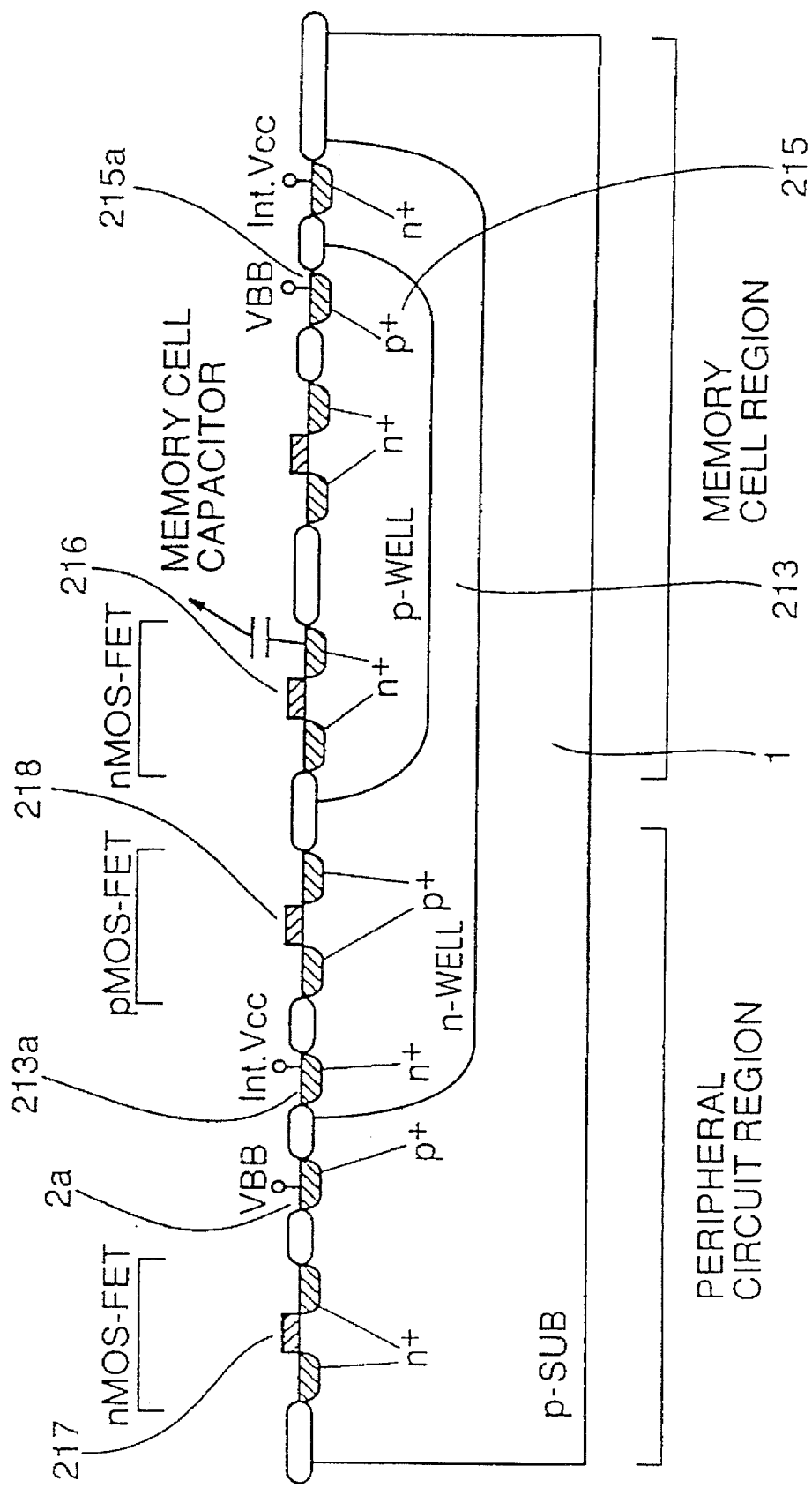
FIGS. 15 to 18 are sectional views showing semiconductor memory devices according to the fifth to the eighth embodiments of the present invention, respectively.

Referring to FIG. 15, an n type MOS transistor 216 is formed in the memory cell region. On the other hand, a CMOS transistor of n type and p type MOS transistors 217 and 218 is formed in the peripheral circuit region.

More specifically, a p type well region 215 is formed in the main surface of semiconductor substrate 1. In the main surface of p type well region 215, n type MOSFET 216 is formed. Further, a p$^+$ type impurity region 215a for fixing the potential of p type well region 215 is formed, to which substrate potential VBB generated by the internal circuitry is applied.

On the other hand, in the peripheral circuit region, n type MOSFET 217 is directly formed in the main surface of semiconductor substrate 1. On the main surface of semiconductor substrate 1, a p$^+$ type impurity region 1a for fixing the potential of semiconductor substrate 1 is formed, to which substrate potential VBB generated by the internal circuitry is applied. Further, an n type well region 213 is formed on the main surface of semiconductor substrate 1 so as to cover p type well 215 in the memory cell region and to extend to the peripheral circuit region. On the main surface of n type well region 213, p type MOSFET 218 constituting the peripheral circuit region is formed. An n$^+$ type impurity region 213a for fixing the potential of n type well region 213 is formed, to which internal power supply voltage Int. Vcc shown in FIG. 13 is applied. Since generation of latch up can be prevented by stable internal power supply voltage Int. Vcc, substrate potential VBB generated by the internal circuitry can be applied to semiconductor substrate 1, as described above.

[Sixth Embodiment]

Figure 16:
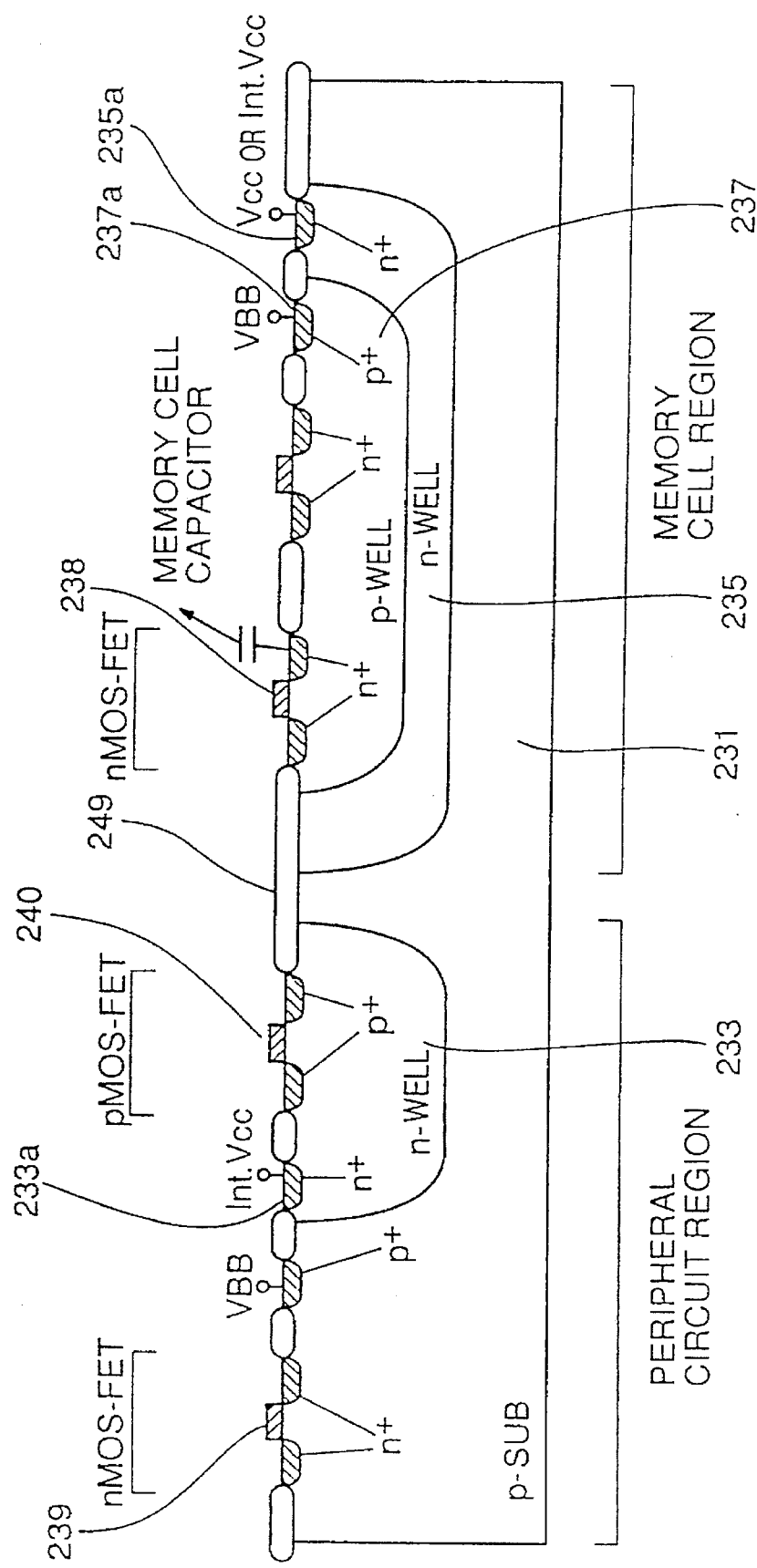

Referring to FIG. 16, an n type MOS transistor 238 is formed in the memory cell region. In the peripheral circuit region, a CMOS transistor including n type and p type MOS transistors 239 and 240 is formed.

More specifically, a p type well region 237 is formed in the main surface of semiconductor substrate 1 in the memory cell region. In the main surface of p type well region 237, n type MOSFET 238 is formed. Further, a p$^+$ type impurity region 237a for fixing the potential of p type well region 237 is formed, to which substrate potential VBB generated by the internal circuitry is applied.

On the other hand, in the peripheral circuit region, n type MOSFET 239 is directly formed in the main surface of semiconductor substrate 1. An n type well region 233 is formed in the main surface of semiconductor substrate 1. In the main surface of n type well region 233, p type MOSFET 240 is formed. An n$^+$ type impurity region 233a for fixing the potential of n type well region 233, to which stable internal power supply potential Int. Vcc is applied.

Further, an n well region 235 is formed so as to cover p type well region 237. An n$^+$ type impurity region 235a for fixing the potential of n type well region 235 is formed, to which power supply potential Vcc is applied.

In this structure, n type well regions 235 and 233 are isolated by an element isolation insulating film 249 formed on the main surface of semiconductor substrate 1 with the LOCOS method. Since these well regions are completely isolated by p type semiconductor substrate 1, they are not in direct contact with each other.

A parasitic transistor which would otherwise be formed of p type MOSFET 240 and n type MOSFET 238 is not structured in the peripheral circuit region in this embodiment. Since the parasitic transistor causes latch up, generation of latch up can be prevented.

As described above, according to the sixth embodiment, generation of latch up can be prevented more completely not only because internal power supply potential Int. Vcc is stable, but also because formation of the parasitic transistor can be prevented structurally.

[Seventh Embodiment]

Figure 17:
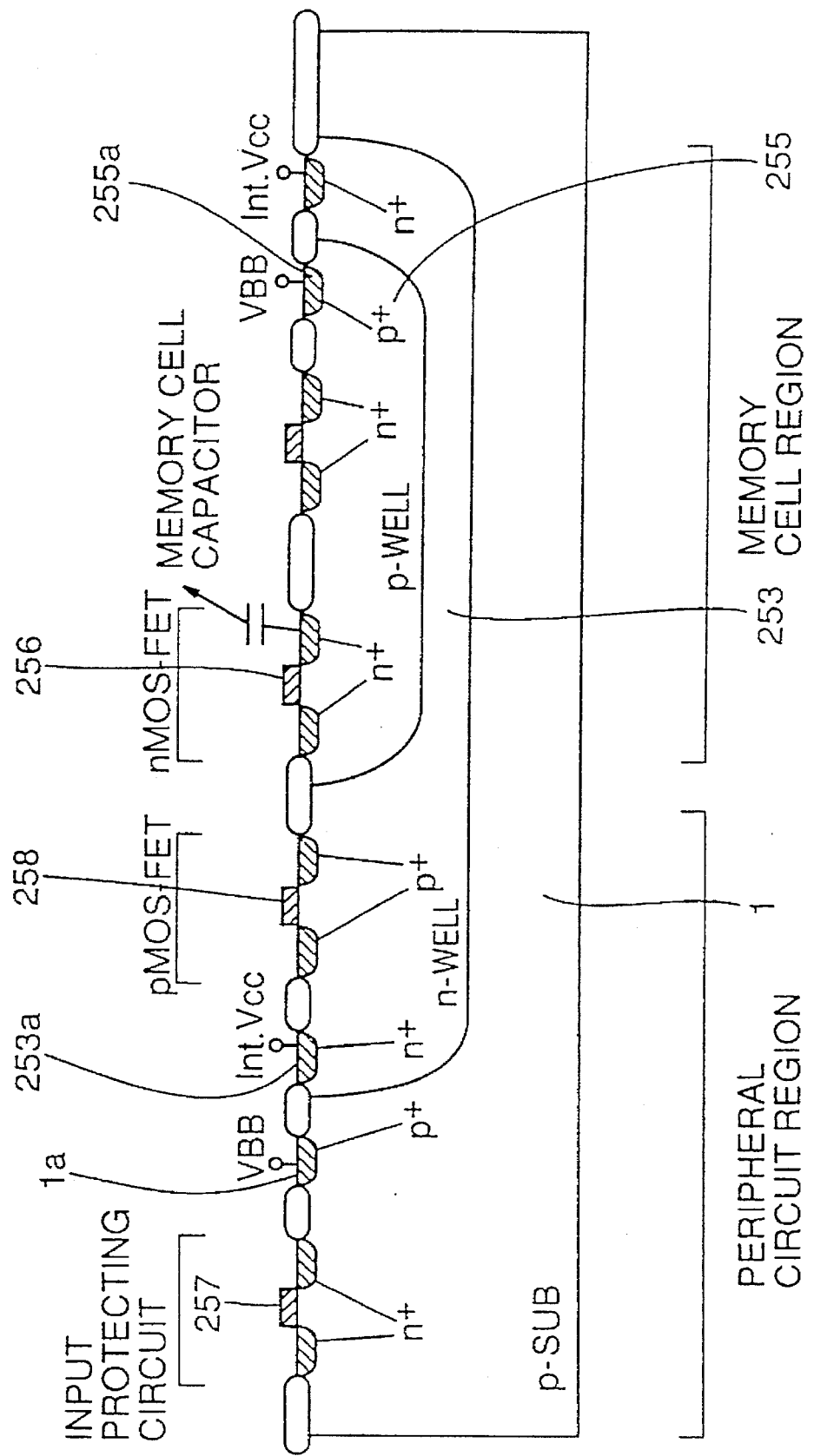

Referring to FIG. 17, an n type MOS transistor 256 is formed in the memory cell region. In the peripheral circuit region, a CMOS transistor including n type and p type MOS transistors 257 and 258 is formed.

More specifically, a p type well region 255 is formed in the main surface of semiconductor substrate 1 in the memory cell region. In the main surface of p type well region 255, n type MOSFET 256 is formed. Further, a $p^+$ type impurity region 255a for fixing the potential of p type well region 255 is formed, to which substrate potential VBB generated by the internal circuitry is applied.

On the other hand, in the peripheral circuit region, n type MOSFET 257 is directly formed in the main surface of semiconductor substrate 1. On the main surface of semiconductor substrate 1, $p^+$ type impurity region 1a for fixing the potential of semiconductor substrate 1 is formed, to which substrate potential VBB generated by the internal circuitry is applied. Further, an n type well region 253 is formed on the main surface of semiconductor substrate 1 so as to cover p type well region 255 in the memory cell region and to extend to the peripheral circuit region. On the main surface of n type well region 253, p type MOSFET 258 constituting the peripheral circuit region is formed. An $n^+$ type impurity region 253a is further formed for fixing the potential of n type well region 253.

Internal power supply voltage Int. Vcc shown in FIG. 12 is applied to $n^+$ type impurity region 253a. Since generation of latch up can be prevented by stable internal power supply voltage Int. Vcc, substrate potential VBB generated by the internal circuitry can be applied to semiconductor substrate 1, as described above.

[Eighth Embodiment]

Figure 18:
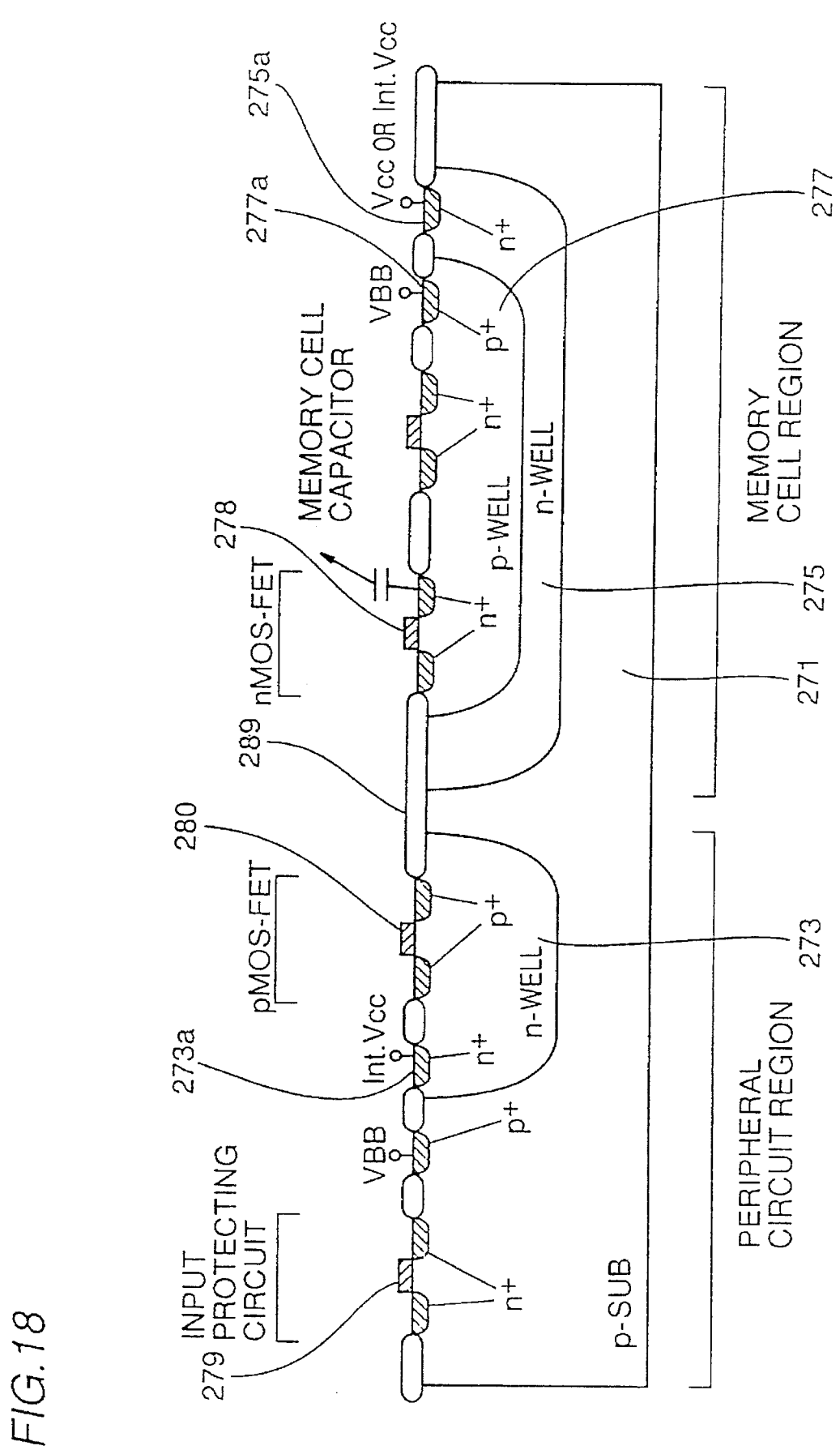

Referring to FIG. 18, an n type MOS transistor 278 is formed in the memory cell region. In the peripheral circuit region, a CMOS transistor including n type and p type MOS transistors 279 and 280 is formed.

More specifically, a p type well region 277 is formed in the main surface of semiconductor substrate 1 in the memory cell region. In the main surface of p type well region 277, n type MOSFET 278 is formed. Further, a $p^+$ type impurity region 277a for fixing the potential of p type well region 277 is formed, to which substrate potential VBB generated by the internal circuitry is applied.

On the other hand, in the peripheral circuit region, n type MOSFET 279 is directly formed in the main surface of semiconductor substrate 1. An n type well region 273 is formed in the main surface of semiconductor substrate 1. In the main surface of n type well region 273, p type MOSFET 280 is formed. An $n^+$ type impurity region 273a for fixing the potential of n type well region 273 is formed, to which stable internal power supply potential Int. Vcc is applied.

Further, an n type well region 275 is formed so as to cover p type well region 277. An $n^+$ type impurity region 275a for fixing the potential of n type well region 275 is formed, to which power supply potential Vcc is applied.

In this structure, n type well regions 275 and 273 are isolated by an element isolation insulating film 289 formed on the main surface of semiconductor substrate 1 with the LOCOS method. Since these well regions are completely isolated by p type semiconductor substrate 1, they are not in direct contact with each other.

A parasitic transistor which would otherwise be formed of p type MOSFET 280 and n type MOSFET 278 is not structured in the peripheral circuit region. Therefore, generation of latch up can be prevented.

As described above, according to the eighth embodiment, generation of latch up can be prevented more completely, not only because internal power supply potential Int. Vcc is stable, but also because formation of the parasitic transistor can be prevented structurally.

As described above, a portion which has no possibility of generating latch up can be formed in the surface portion of the semiconductor substrate to which substrate potential VBB generated by the internal circuitry is applied. The ninth embodiment shown in FIG. 20 and the tenth embodiment shown in FIG. 21 are taken as examples.

[Ninth Embodiment]

Figure 19:
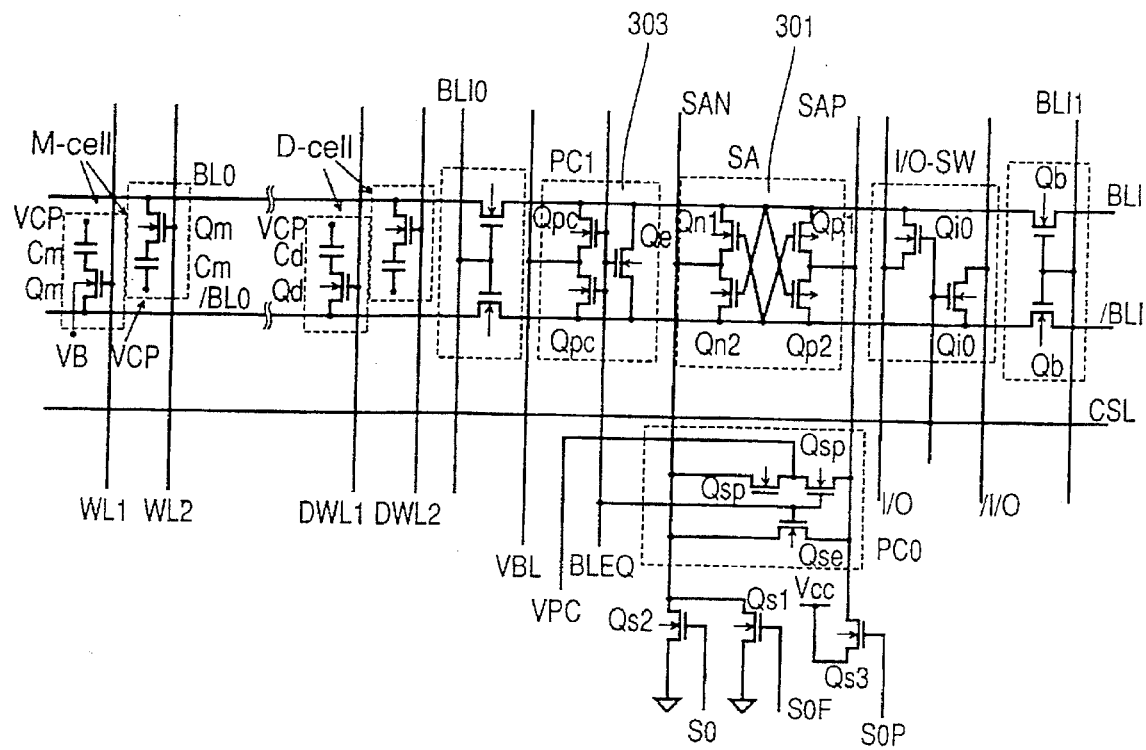
FIG. 19 is a general circuit diagram of a semiconductor memory device.
Figure 20:
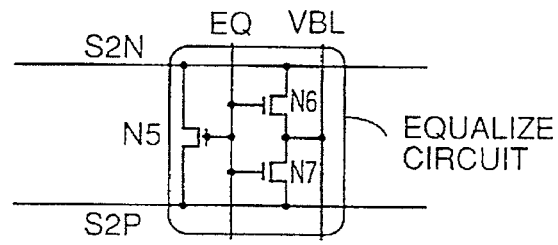
FIGS. 20 and 21 are circuit diagrams showing semiconductor memory devices according to ninth and tenth embodiments of the present invention, respectively.
Figure 21:
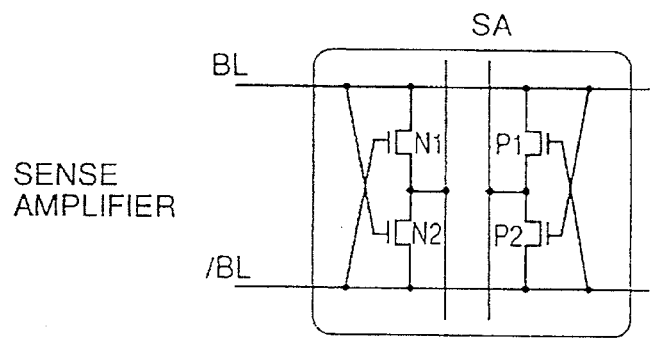

The circuit shown in FIG. 20 corresponds to an equalize circuit 303 in the semiconductor memory device shown in FIG. 19. Since the equalize circuit is constituted only of n type MOSFETs, a CMOS structure is not formed in the circuit, and therefore, there is no possibility of generation of latch up.

[Tenth Embodiment]

The circuit shown in FIG. 21 corresponds to a sense amplifier 301 in the semiconductor memory device shown in FIG. 19. Since the sense amplifier forms a CMOS structure which is not directly connected to the power supply potential or the ground potential, there is no possibility of generation of latch up.

[Eleventh Embodiment]

The semiconductor memory device according to the eleventh embodiment will now be described with reference to FIGS. 22 and 23.

In a storage device such as a DRAM in general, an electron-hole pair is generated from a substrate due to α particles incident on a chip, and in response to the pair entering a storage node of a memory cell, storage data is destroyed. This is a soft error phenomenon. The soft error is generated by the α particles according to the following mechanism. Since an MOS capacitor is used as a memory in the DRAM, a depletion layer is formed under its capacitor electrode. Signal data stored in the memory, that is, "1" and "0", correspond to the cases where there is no electric charge in the capacitor and where there is electric charge in the capacitor, respectively. If particles having high energy such as α particles are incident on an Si wafer externally when the memory data is "1", indicating that there is no electric charge in the capacitor, this causes generation of electron-hole pairs. Electrons of the pairs are attracted by the capacitor (holes flow to the substrate). As a result, the memory data changes to "0", indicating that there is electric charge in the capacitor, although the memory is not operated externally at all. This change does not mean destruction of the hardware (semiconductor device), and the changed state returns to its original state in the meantime. Therefore, this change is called a soft error. However, this causes erroneous operation of the memory, as in the case where the hardware is destroyed.

The source of the α particles is a radioactive impurity element such as U and Th which is contained in an LSI material of a package and an interconnection line by a very small amount. When the radioactive impurity element was discussed in this field for the first time, the amount of U or Th was on the order of ppm (⅟₁,₀₀₀,₀₀₀). However, the amount of U or Th on the order of ppb (1/1,000,000,000) has been discussed these days. This is because the higher integration level of the memory decreases the amount of electric charge (signal) stored in one memory. U or Th on the order of ppb is contained in every material unless the purity is increased in a special way. This means that if a new material is going to be used as an LSI material, the purity of the material must be increased to decrease the concentration of U or Th contained therein. Otherwise, the material cannot be used whatever superior characteristic can be achieved. Although not described in detail, an error caused by the α particles has bad influence not only on a memory LSI such as a DRAM but also on an LSI device other than the memory as a noise source and the like.

As described, the α particles having energy of several MeV emitted by destruction of the radioactive material travel several ten μm in silicon forming the semiconductor substrate before stop while generating electron-hole pairs by impact ionization. When energy in the α particles is E and energy generated by the electron-hole pairs is ε, electric charge Q to be generated is given by the following expression (1):

$$Q=eE/\epsilon \qquad (1)$$

Since ε=about 3.6 eV and E=about 5 MeV in silicon in general, Q=220 fC.

This is on the same order as the amount of electric charge stored in an ordinary memory cell. There is the possibility of destruction of storage data of a memory cell by flow-in of generated carriers.

The amount Qt of generated carriers collected by a memory cell is given by the following expression (2):

$$Qt=Qdr+Qdi+Qf \qquad (2)$$

In the above expression, Qdr is a drifting component of electric charge in a depletion layer at a pn junction, Qdi is a component diffused by a local inclination of the minority carrier concentration, and Qf is a component by the funneling effect.

The funneling effect in the third term of the expression (2) means the carriers collected by a high electric field region being temporarily extending in a funnel manner when the α particles pierce the depletion layer of width W. By the α particles being incident on the depletion layer of a high resistance supporting the junction bias, the depletion layer is brought to a low resistance state temporarily. As a result, the depletion layer instantaneously extends to where it can support the junction bias. By this phenomenon, the apparent width of the depletion layer from the standpoint of collection of induced electrons is increased from W to one given by the following expression (3):

$$W(1+\mu n/\mu p) \qquad (3)$$

In the above expression, μn and μp are electron mobility and hole mobility. In the case of silicon, μn/μp is generally 3 or more. Therefore, the carrier collecting effect equivalent to the case where the depletion layer width is approximately four times its original width is brought about by the funneling effect. The values of μn/μp in typical semiconductor materials such as Si, Ge, GaAs, GaP, GaSb, InP, and InAs are approximately 3, 2, 21, 2, 5, 40, and 113, respectively.

As described above, some materials have a large μn/μp value. By a large contribution of the funneling effect, the carrier collecting effect is increased, and the soft error ratio is increased.

Figure 22:
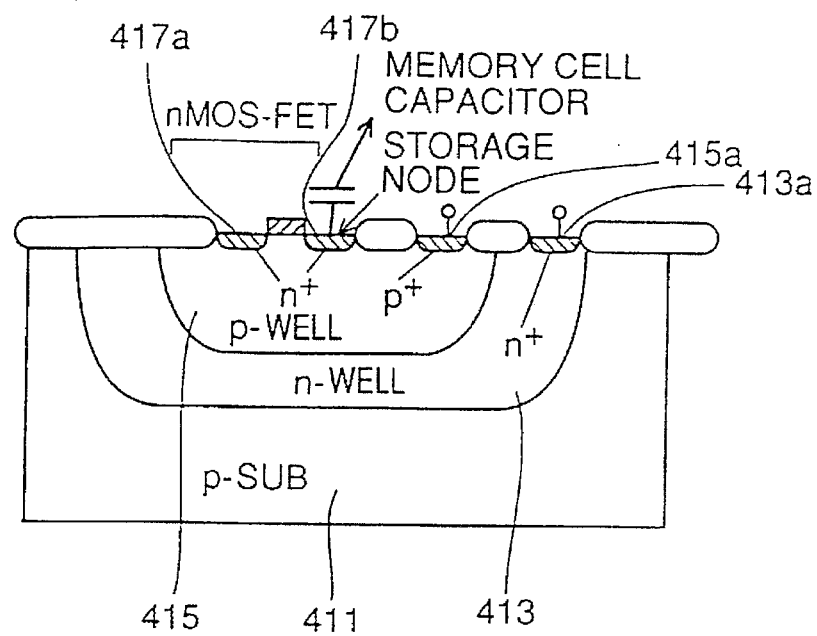
FIGS. 22 and 23 are sectional views showing a semiconductor memory device according to an eleventh embodiment of the present invention.
Figure 23:
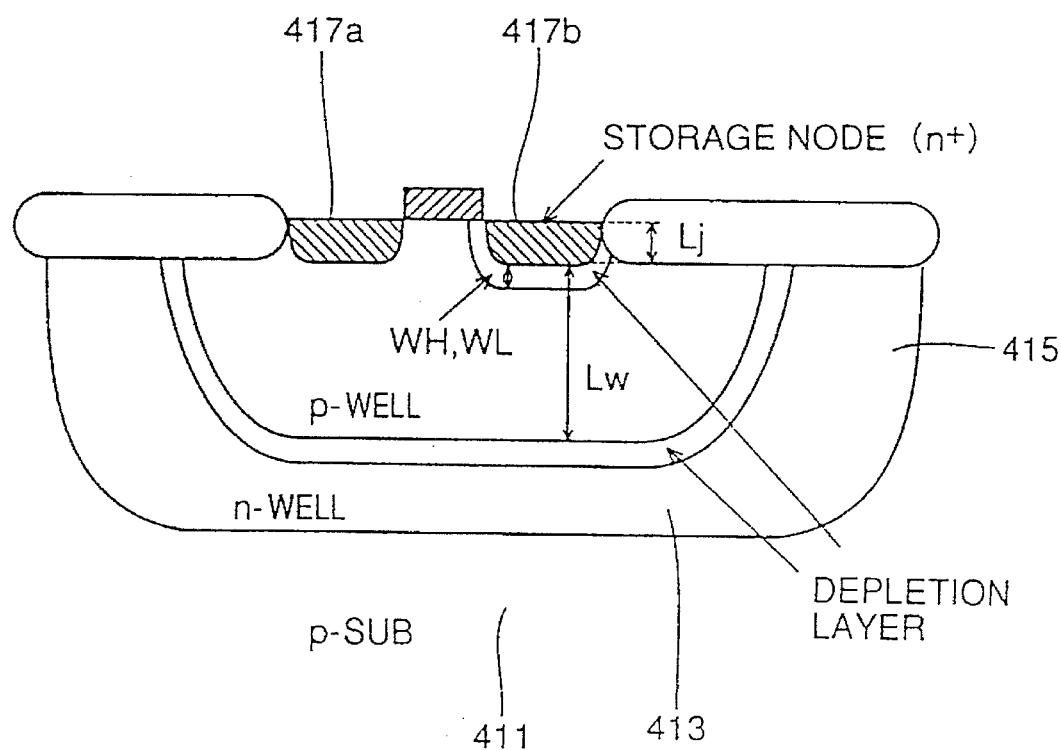

In view of the above, the eleventh embodiment shown in FIGS. 22 and 23 is implemented for decreasing the carrier collecting effect by the funneling phenomenon to reduce the soft error ratio.

FIGS. 22 and 23 are enlarged views of a memory cell region in a so-called triple well structure as shown in FIG. 2. In the eleventh embodiment shown in FIG. 22, an n well region 413 is formed on the main surface of a semiconductor substrate 411, and a p type well region 415 is formed on the main surface of semiconductor substrate 411 so as to be covered with n type well region 413. An n type MOSFET 418 is formed on the main surface of p type well region 415. Further, a p⁺ type impurity region 415a and an n⁺ type impurity region 413a for fixing the potentials of p type well region 415 and n type well region 413, respectively, are formed.

FIG. 23 shows in detail a peripheral portion of the n type MOSFET of the memory cell region shown in FIG. 22.

In such a structure as described above, the relationship given by the following expression (4) holds among Lw, the depth of p type well region 415, Lj, the thickness of the storage node, and WH, the thickness of the depletion layer when the High level is stored in the memory cell node:

$$WH<Lw-Lj<WH(1+\mu n/\mu p) \qquad (4)$$

In this case, since the bottom of p type well region 415 is under the bottom of the depletion layer in a normal operation mode where the α particles do not enter, the semiconductor memory device operates in the normal operation mode without any trouble.

On the other hand, when the α particles enter and the substantial extension of the depletion layer is W(1+μn/μp) by the funneling effect, the extension of the depletion layer reaches the bottom of p type well region 415. The extension further reaches the depletion layer at the boundary between the bottom of p type well region 415 and n type well region 413 formed thereunder. Therefore, generated electric charge moves in the direction of a memory cell in the upper portion and in the direction of n type well region 413 in the lower portion. As a result, the electric charge collection efficiency to the memory cell node is decreased, and the soft error ratio is decreased. The electric charge collected in the memory cell is determined by the initial potential of the memory cell node, the potential of the n type well region positioned in the lower portion, the size of each portion and the like.

First Case $$WH<Lw-Lj<WH(1+\mu n/\mu p) \qquad (4)$$

(WH: the thickness of the depletion layer when the "H" level is stored in the memory cell node)

$$WL(1+\mu n/\mu p)<Lw-Lj \qquad (5)$$

(WL: the thickness of the depletion layer when the "L" level is stored in the memory cell node), and $$V(n\text{-well})=VH \qquad (6)$$

(V(n-well): the applied potential of the lower n well, VH: the potential when "H" level data is stored in the memory cell)

In this first case, as indicated by the expression (4), when the "H" level is stored in the memory cell node, the extension of the depletion layer by the funneling phenomenon reaches the bottom of the p well. Further, as indicated by the expression (6), the potential of the lower n well is equal to the "H" level potential of the memory cell node. Therefore, the electric field is not generated in the depletion layer, and the generated electron-hole pairs are recombined to each other. As a result, electric charge is not collected in the memory cell node, and the soft error phenomenon does not occur.

As indicated by the expression (5), when the "L" level is stored in the memory cell node, the extension of the depletion layer by the funneling phenomenon does not reach the bottom of the p well. Therefore, generated electrons are collected by the memory cell node, and holes move in the direction of the lower n well. This causes the potential at the memory cell node to decrease, thereby further decreasing the "L" level. As a result, the soft error phenomenon does not occur.

When the following expression (7) holds, if the "H" level is stored in the memory cell node, the "H" level is further increased. Similar to the above first case, the soft error phenomenon does not occur:

$$V(n\text{-well}) > VH \qquad (7)$$

Second Case $$WH < Lw - Lj < WH(1 + \mu n/\mu p) \qquad (4)$$

(WH: the thickness of the depletion layer where the "H" level is stored in the memory cell node)

$$Lw - Lj < WL(1 + \mu n/\mu p) \qquad (8)$$

(WL: the thickness of the depletion layer when the "L" level is stored in the memory cell node)

$$V(n\text{-well}) \geq (VH + VL)/2 \qquad (9)$$

(V(n-well): the applied potential of the lower n well, VH: the potential when "H" level data is stored in the memory cell)

In this second case, the electric field caused by the funneling phenomenon at the time of entering of the α particles reaches the lower well when memory cell data is either at the "H" level or the "L" level. However, the electric field reaches more sufficiently when the "H" data is stored. The electric field reaches the lower well less sufficiently when the "L" data is stored. Therefore, when the lower well potential V(n-well) has such a relationship as shown by the expression (9), VH changes downwards and VL changes upwards. However, neither VH nor VL comes to reach (VH+VL)/2 (or difficult to come to reach the same). Therefore, storage data is not inverted. Actually, the similar effect is obtained under the intermediate condition between the above described first and second cases.

Note that in silicon, the respective sizes are typically as follows:

WH=0.2 μm

LW=0.5 μm

Lj=0.1 μm

WL=0.1 μm

VH=3.0 V

VL=0 V

These values satisfy the above expressions.

[Twelfth Embodiment]

In the eleventh embodiment shown in FIGS. 22 and 23, as the value of μn/μp is larger, the upper limit of the depth of the p type well region is larger. Therefore, the step of manufacturing the semiconductor device becomes easier. From this standpoint, by using GaAs, the structure of the eleventh embodiment is readily formed, since GaAs has a large μn/μp value of 21, as described in the eleventh embodiment.

Figure 24:
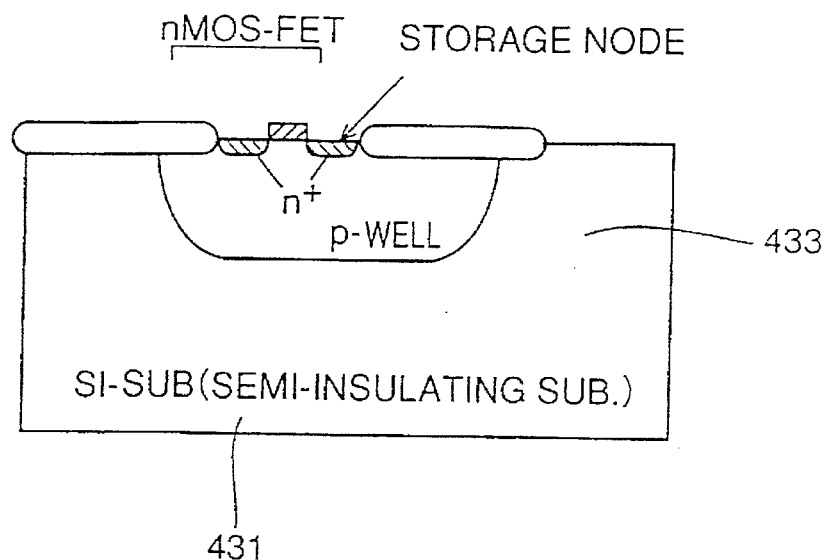
FIGS. 24 and 25 are sectional views showing a semiconductor memory device according to a twelfth embodiment of the present invention.
Figure 25:
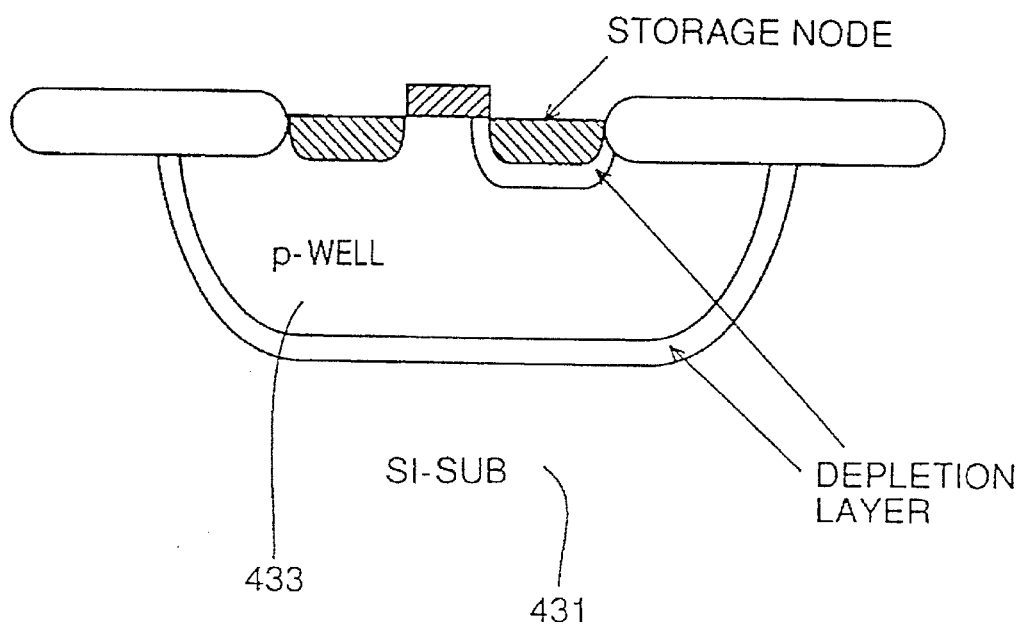
Figure 26:
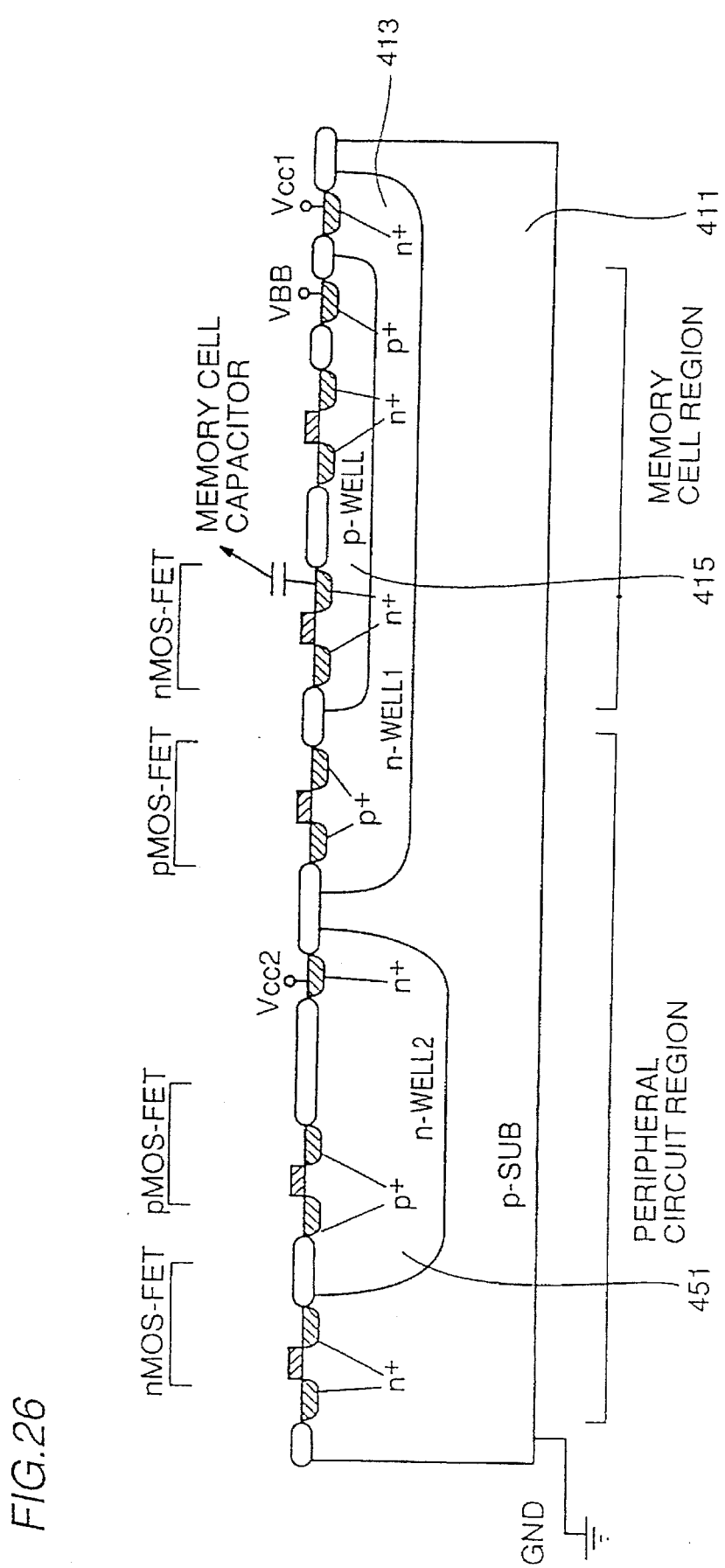
FIGS. 26 to 28 are sectional views showing semiconductor memory devices according to thirteenth to fifteenth embodiments of the present invention, respectively.
Figure 27:
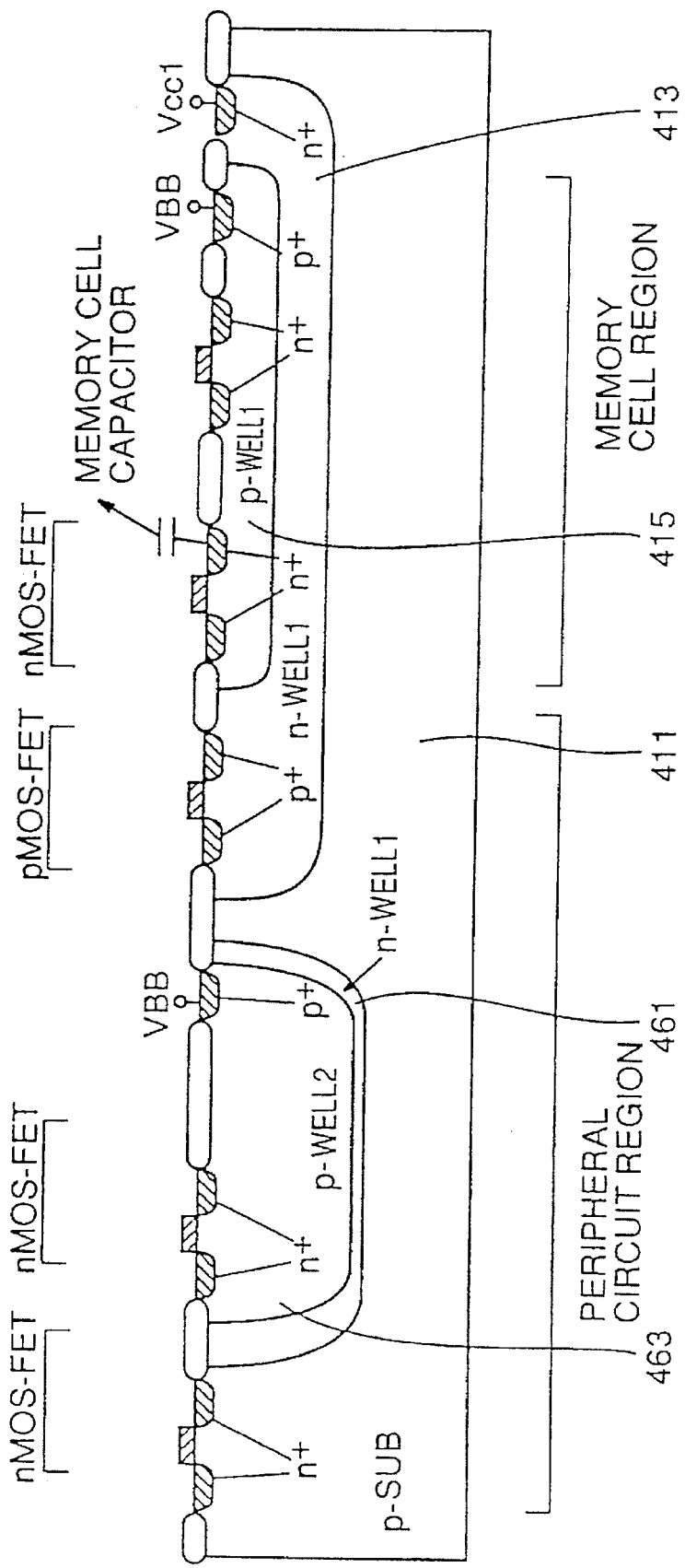
Figure 28:
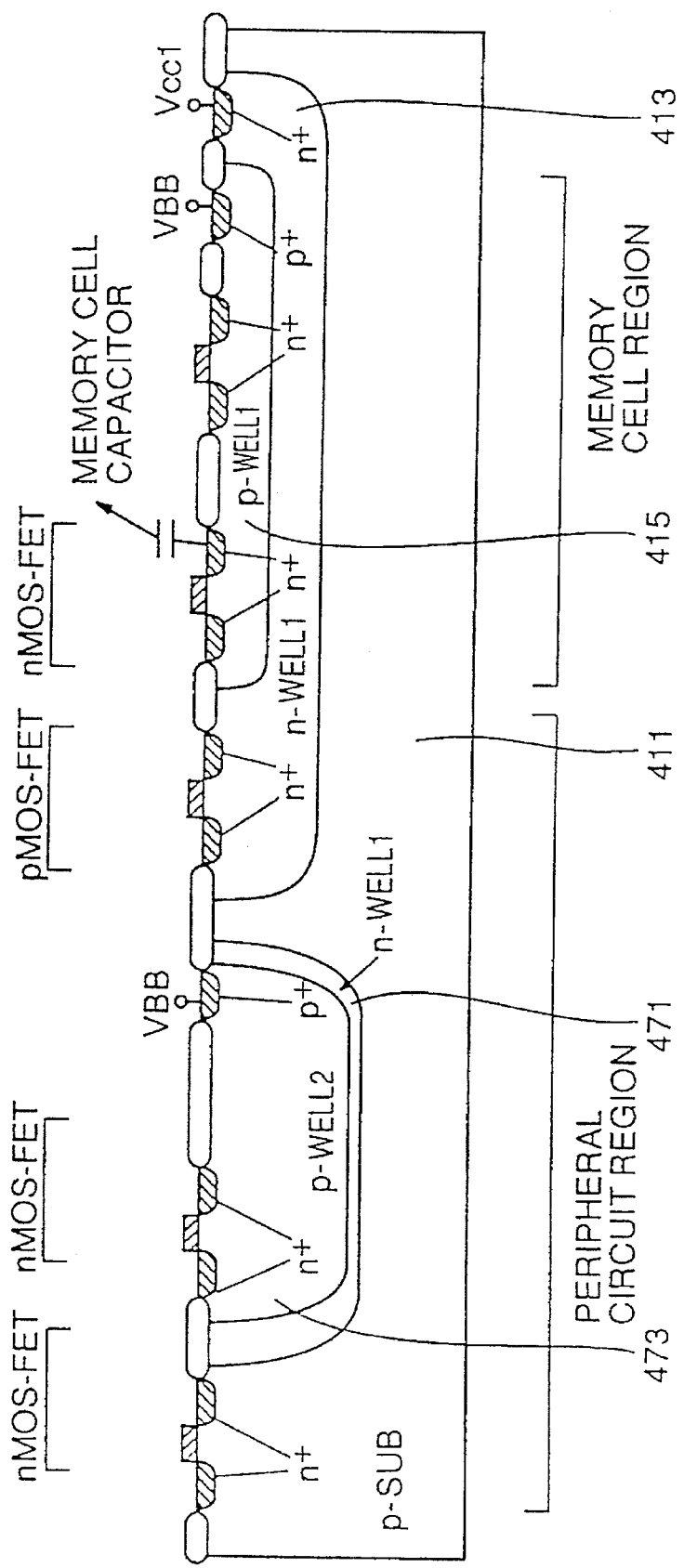

In view of the above, FIGS. 24 and 25 are sectional views of a semiconductor memory device using GaAs. FIGS. 24 and 25 show an example of a static RAM using an MOSFET. The similar effect can be obtained even if a substrate material is a compound semiconductor.

[Thirteenth Embodiment]

The semiconductor device in the thirteenth embodiment employs any structure of the eleventh and twelfth embodiments shown in FIGS. 22 to 25 in a memory cell region. Further, an n type well region 451 constituting the peripheral circuit region is formed separately from another n type well region 413. Therefore, the well potentials can be set independently, and the memory cell region and the peripheral circuit region can be optimized easily.

If n type well region 451 in a peripheral circuit region is formed as shallow as n type well region 413 constituting the memory cell region, the well resistance of n type well region 451 is increased, causing latch up. Therefore, n type well region 451 in the peripheral circuit region is formed deep as in the conventional case.

[Fourteenth Embodiment]

The semiconductor device in the fourteenth embodiment employs any structure of the eleventh and twelfth embodiments shown in FIGS. 22 to 25 in a memory cell region. Further, an n type well region 461 constituting the peripheral circuit region is formed separately from another n type well region 413. Therefore, the well potentials can be set independently, and the memory cell region and the peripheral circuit region can be optimized easily.

If n type well region 461 in the peripheral circuit region is formed as shallow as n type well region 413 constituting the memory cell region, a p type well region 463 formed so as to be covered with n type well region 461 must be shallow. As a result, the well resistance of p type well region 463 is increased, causing latch up. Therefore, n type well region 461 in the peripheral circuit region is formed deep, similar to the conventional case.

[Fifteen Embodiment]

The semiconductor device in the fifteenth embodiment employs any structure of the eleventh and twelfth embodiments shown in FIGS. 22 to 25 in a memory cell region. Further, an n type well region 471 constituting the peripheral circuit region is formed separately from another n type well region 413. Therefore, the well potentials can be set independently, and the memory cell region and the peripheral circuit region can be optimized easily.

If n type well region 471 in the peripheral circuit region is formed as shallow as n type well region 413 constituting the memory cell region, a p type well region 473 formed so as to be covered with n type well region 471 must be shallow. As a result, the well resistance of p type well region 473 is increased, causing latch up. Therefore, n type well region 471 in the peripheral circuit region is formed deep, similar to the conventional case.

Further, in the fifteenth embodiment, in a portion 475 having the possibility of a soft error in the peripheral circuit region, such as a latch circuit portion having a small transistor size, the soft error ratio is decreased by forming shallow well 415 as in the memory cell region.

[Sixteenth Embodiment]

For element isolation, a structure called a field shield (FS) method is used. This has an isolation structure similar to that of an MOSFET in a so-called off state by an FS gate and an oxide film formed thereunder.

Figure 29:
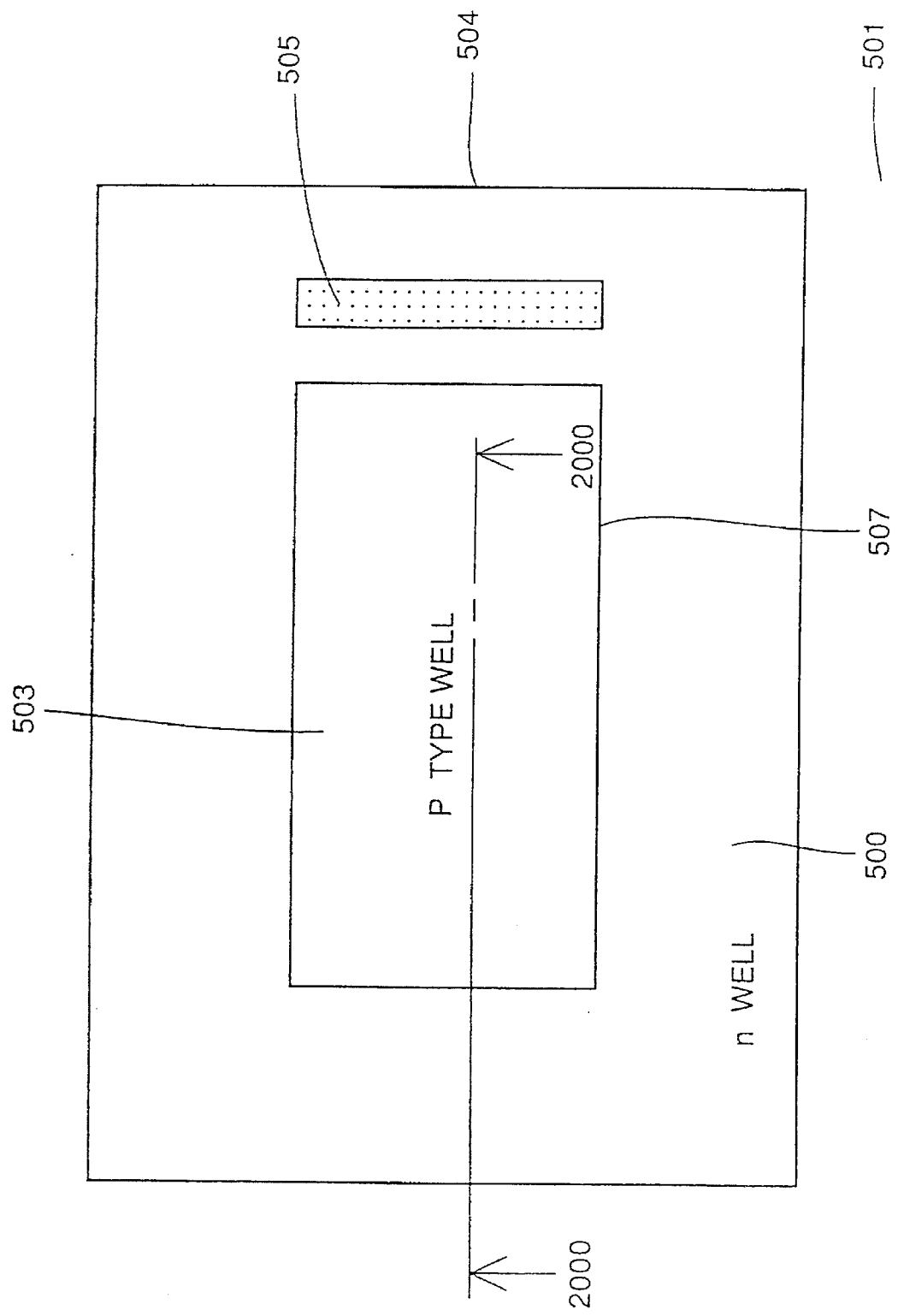
FIGS. 29 and 30 are a plan view and a sectional view showing a semiconductor memory device according to a sixteenth embodiment of the present invention.

FIG. 29 shows isolation between wells in a triple well structure by the FS method. An n type well region 500 is formed so as to cover a p type well region 503. In a predetermined region of a p type semiconductor substrate 501, n type well region 500 is formed. An $n^+$ type impurity region 505 for fixing the potential of n type well region 500 is formed in a predetermined region of n type well region 500. In the above structure, boundary portions 507 and 504 between p type well region 503 and n type well region 500 and n type well region 500 and p type semiconductor substrate 501 are isolated by the FS method.

Figure 30:
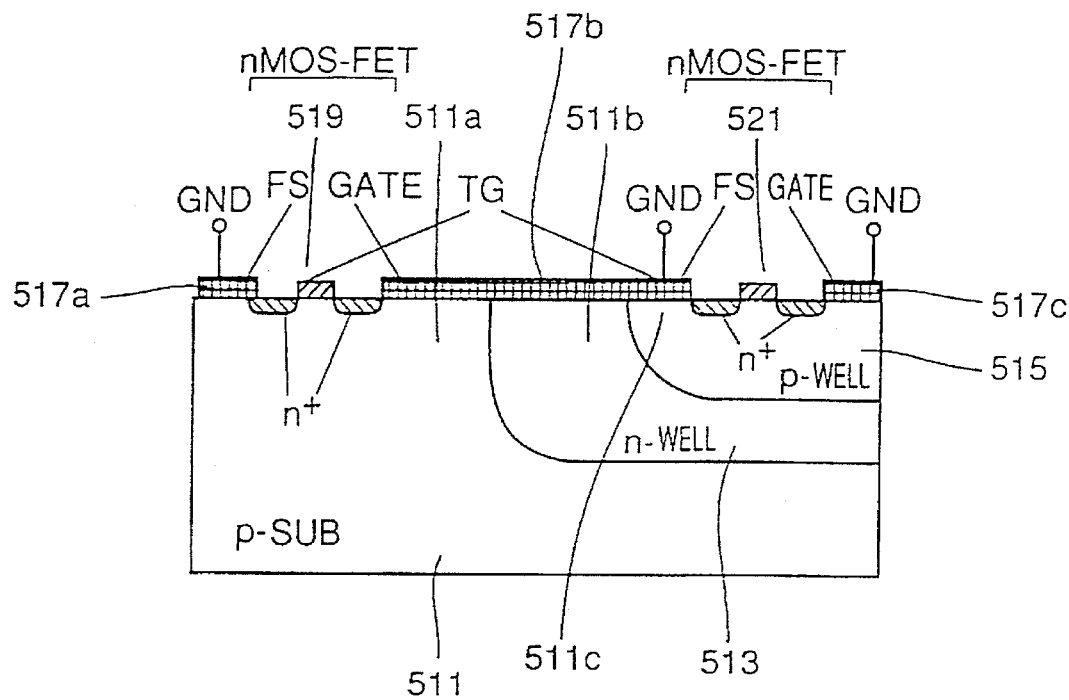

FIG. 30 is a sectional view taken along the line 2000–2000 of the semiconductor memory device according to the sixteenth embodiment shown in FIG. 29.

Referring to FIG. 30, n type MOSFETs 519 and 521 are formed in the main surface of a semiconductor substrate 511. One n type MOSFET 519 is directly formed in the main surface of semiconductor substrate 511. The other n type MOSFET 521 is formed in a predetermined region of the main surface of a p type well region 515 formed in a predetermined region of the main surface of semiconductor substrate 511. Further, an n type well region 513 is formed on the main surface of semiconductor substrate 511 so as to cover p type well region 515. FS element isolation films 517a, 517b, and 517c are formed in predetermined regions of the main surface of semiconductor substrate 511, n type well region 513, and p type well region 515.

Ground potential GND is applied to FS element isolation films 517a, 517b, and 517c. Therefore, since a parasitic n MOSFET is in an off state in p type regions 511a and 511c in the main surface of semiconductor substrate 511, n type MOSFETs 519 and 521 are electrically isolated. On the other hand, since a parasitic p MOSFET is in an on state in n type region 511b in the main surface of semiconductor substrate 511, p type regions 511a and 511c are not electrically isolated. However, when semiconductor substrate 511 and t type well region 515 are equal in potential, no problem occurs.

By such a function as described above, the structure at the boundary portion in a so-called triple well structure can be simplified.

[Seventeenth Embodiment]

Figure 31:
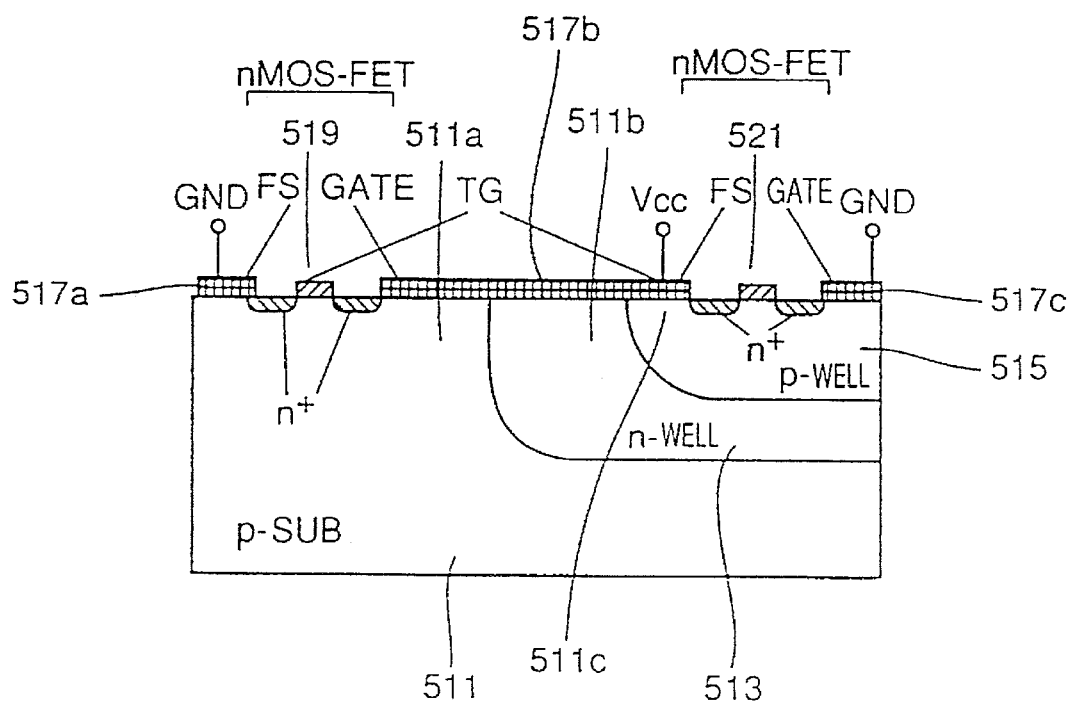
FIG. 31 is a sectional view showing a semiconductor memory device according to a seventeenth embodiment of the present invention.

Referring to FIG. 31, n type MOSFETs 519 and 521 are formed in the main surface of semiconductor substrate 511. One n type MOSFET 519 is directly formed in the main surface of semiconductor substrate 511. The other n type MOSFET 521 is formed in a predetermined region of the main surface of p type well region 515 formed in a predetermined region of the main surface of semiconductor substrate 511. Further, n type well region 513 is formed on the main surface of semiconductor substrate 511 so as to cover p type well region 515. FS element isolation films 517a, 517b, and 517c are formed on the main surface of semiconductor substrate 515, the main surface of n type well region 513, and the main surface of p type well region 515.

Ground potential GND, power supply potential Vcc, and ground potential GND are applied to FS element isolation films 517a, 517b, and 517c, respectively. Therefore, since a parasitic p MOSFET is in an off state in n type region 511b in the main surface of semiconductor substrate 511, p type regions 511a and 511c are electrically isolated. On the other hand, since a parasitic n MOSFET is in an on state in p type regions 511a and 511c in the main surface of semiconductor substrate 511, n MOSFETs 519 and 521 and n type region 511b are not electrically isolated. However, since sufficient isolation is obtained in n type region 511b as described above, the element isolation structure of the present embodiment can be applied to the case where p type well region 515 and semiconductor substrate 511 are different in potential.

By such a function as described above, the structure at a boundary portion in a so-called triple well structure can be simplified.

[Eighteenth Embodiment]

In the semiconductor memory device according to the eighteenth embodiment, the respective wells are isolated by the FS method, similarly to the case shown in the sixteenth embodiment.

Figure 32:
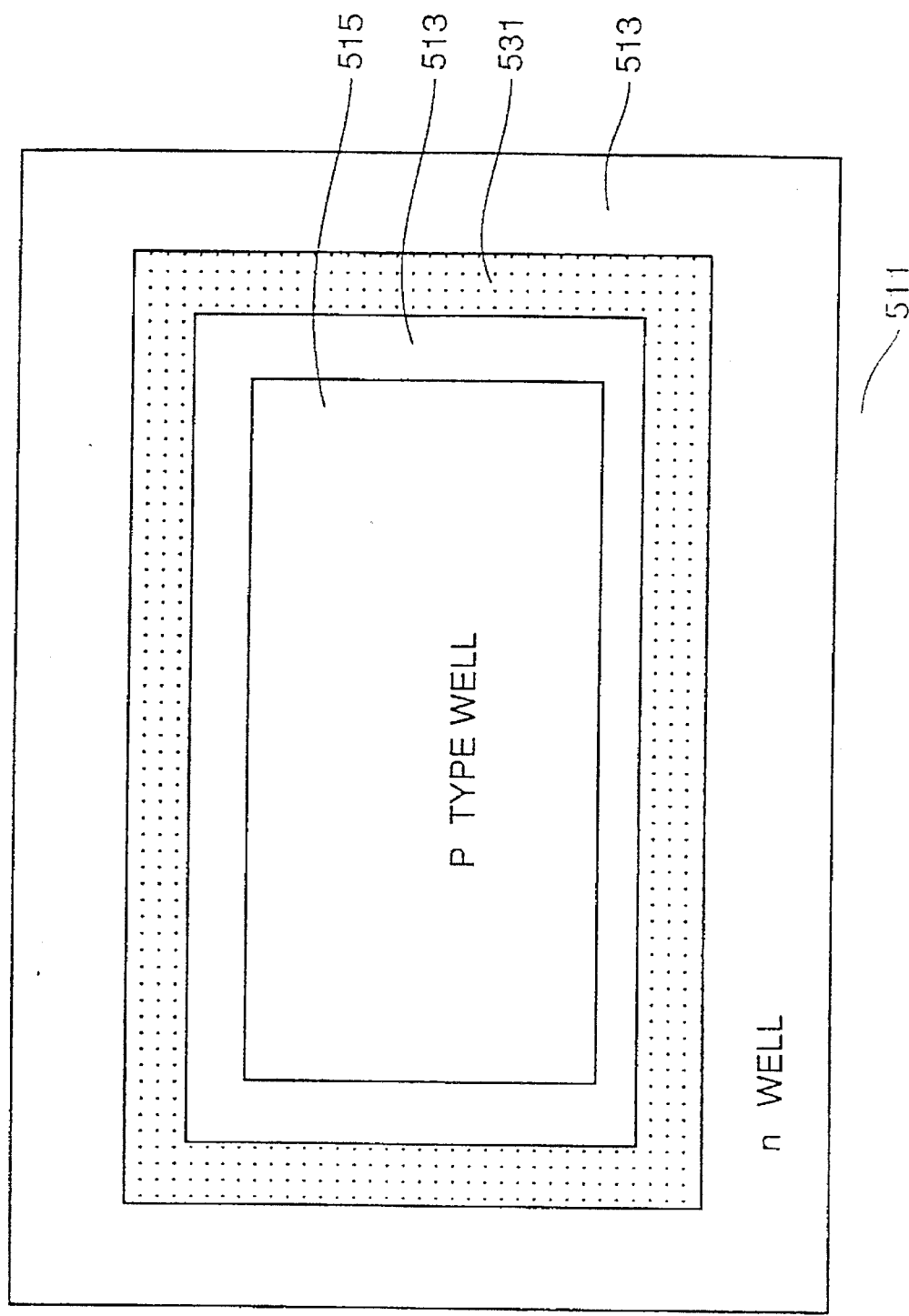
FIGS. 32 and 33 are a plan view and a sectional view showing a semiconductor memory device according to an eighteenth embodiment of the present invention.

Referring to FIG. 32, n type well region 513 is formed so as to cover p type well region 515. In a predetermined region of n type well region 513, an $n^+$ type impurity region 531 for fixing the potential of n type well region 513 is formed. The n type well region 513 is formed in a predetermined region of p type semiconductor substrate 511.

In the above structure, boundary portions between p type well region 515 and n type well region 513 and between n type well region 513 and p type semiconductor substrate 511 are isolated by the FS method.

Figure 33:
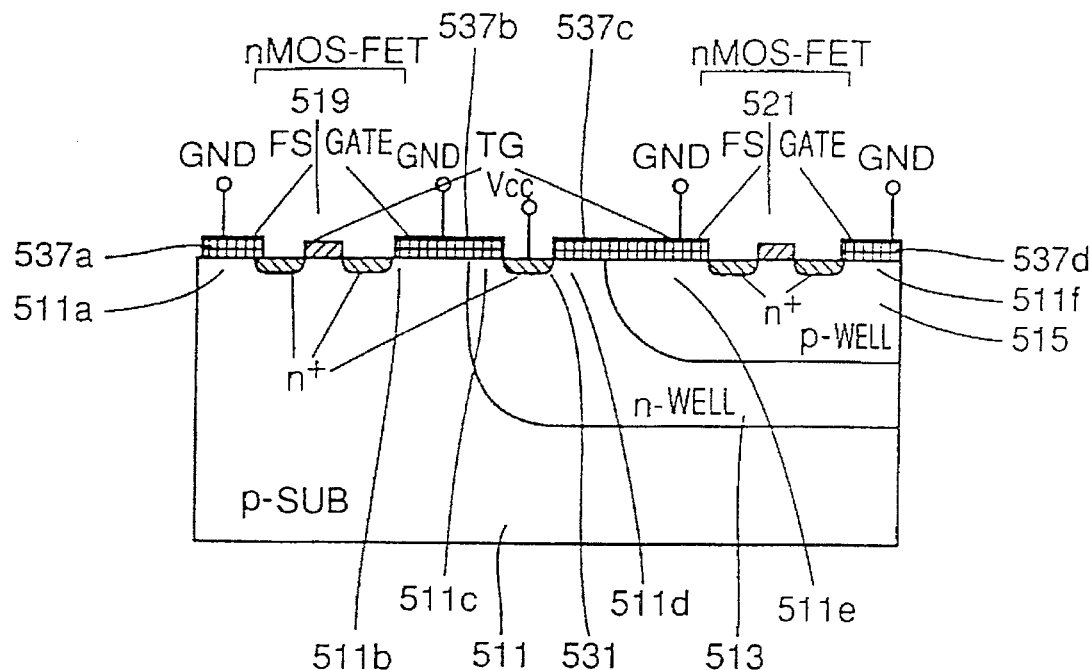

Referring to FIG. 33, n type MOSFETs 519 and 521 are formed in the main surface of semiconductor substrate 511. One n type MOSFET 519 is directly formed in the main surface of semiconductor substrate 511. The other n type MOSFET 521 is formed in a predetermined region of the main surface of p type well region 515 formed in a predetermined region of the main surface of semiconductor substrate 511. Further, n type well region 513 is formed on the main surface of semiconductor substrate 511 so as to cover p type well region 515. In a predetermined region of the main surface of n type well region 513, $n^+$ type impurity region 531 for fixing the potential of n type well region 513 is formed. FS element isolation films 537a, 537b, 537c, and 537d are formed in predetermined regions of the main surface of semiconductor substrate 511, n type well region 513, and p type well region 515.

Power supply potential Vcc is applied to $n^+$ type impurity region 531.

Ground potential GND is applied to FS element isolation films 537a, 537b, 537c, and 537d. Therefore, since a parasitic n MOSFET in p type regions 511b and 511e in the main surface of semiconductor substrate 511 is in an off state, n MOSFETs 519 and 521 are electrically isolated. On the other hand, since a parasitic p MOSFET in n type regions 511c and 511d in the main surface of semiconductor substrate 511 is in an on state, p type regions 511b and 511e are not electrically isolated. However, a channel under the FS element isolation films is separated by $n^+$ type impurity region 531. Therefore, semiconductor substrate 511 and p type well region 515 are electrically isolated. The structure of the present embodiment can be applied to the case where semiconductor substrate 511 and p type well region 515 are different in potential.

By such a function as described above, the structure of the boundary portion in a so-called triple well structure can be simplified.

Further, since power supply potential Vcc applied to $n^+$ type impurity region 531 is applied to n type well region 513, the potential of the well region can be fixed stably. Therefore, resistance to latch up can be increased.

[Nineteenth Embodiment]

Figure 34:
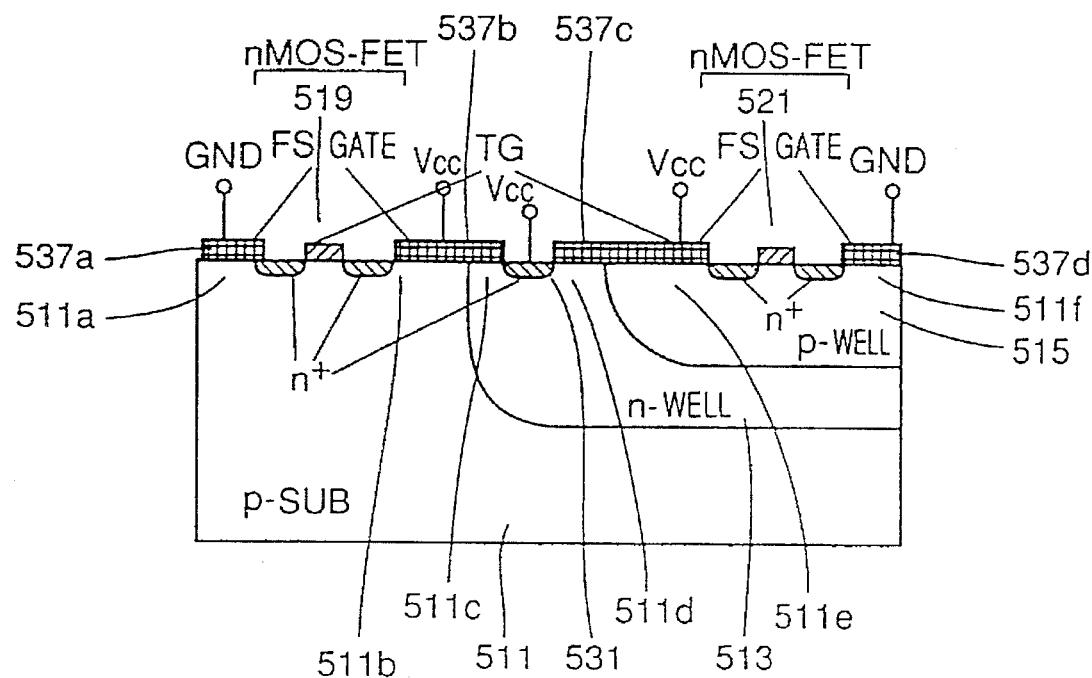
FIGS. 34 to 39 are sectional views showing semiconductor memory devices according to nineteenth to twenty-fourth embodiments of the present invention.

Referring to FIG. 34, n type MOSFETs 519 and 521 are formed in the main surface of semiconductor substrate 511. One n type MOSFET 519 is directly formed in the main surface of semiconductor substrate 511. The other n type MOSFET 521 is formed in a predetermined region of the main surface of p type well region 515 formed in a predetermined region of the main surface of semiconductor substrate 511. Further, n type well region 513 is formed on the main surface of semiconductor substrate 511 so as to cover p type well region 515. In a predetermined region of the main surface of n type well region 513, $n^+$ type impurity region 531 for fixing the potential of n type well region 513 is formed. FS element isolation films 537a, 537b, 537c, and 537d are formed in predetermined regions on the main surfaces of semiconductor substrate 511, n type well region 513, and p type well region 515. Power supply potential Vcc is applied to $n^+$ type impurity region 531.

Ground potential GND, power supply potential Vcc, and ground potential GND are applied to FS element isolation films 537a, 537b and 537c, and 537d, respectively. Therefore, since a parasitic p MOSFET is in an off state in n type regions 511c and 511d in the main surface of semiconductor substrate 511, n type MOSFETs 519 and 521 are electrically isolated. On the other hand, since a parasitic n MOSFET is in an on state in p type regions 511b and 511e of the main surface of semiconductor substrate 511, n type regions 511c and n type MOSFET 519, and n type region 511d and n type MOSFET 521 are not electrically isolated, respectively. However, in addition to electrical isolation in n type regions 511c and 511d as described above, a channel under the FS films is separated by $n^+$ type impurity region 531. Therefore, semiconductor substrate 511 and p type well region 515 are electrically isolated. The structure of the present embodiment can be applied to the case where semiconductor substrate 511 and p type well region 515 are different in potential.

By such a function as described above, the structure of the boundary portion in a so-called triple well structure can be simplified.

Further, since power supply potential Vcc applied to conductive region 531 is applied to n type well region 513, the potential at the well region can be fixed stably. Therefore, resistance to latch up can be increased.

[Twentieth Embodiment]

In general, an input portion connected to an external signal input of a semiconductor device includes a protecting circuit for preventing a so-called electrostatic destruction, in which an internal circuit portion is destroyed by application of a high external surge voltage. On the other hand, a triple well structure is used at an input pin node for decreasing input pin capacitance. In this case, by applying not the ground potential but substrate potential VBB generated by the internal circuitry to the node as a well potential, the junction capacitance is decreased. According to the above described structure, the input protecting circuit is formed in a shallow well. Since this well has a small stray capacitance, the input protecting circuit sometimes cannot function properly.

Figure 35:
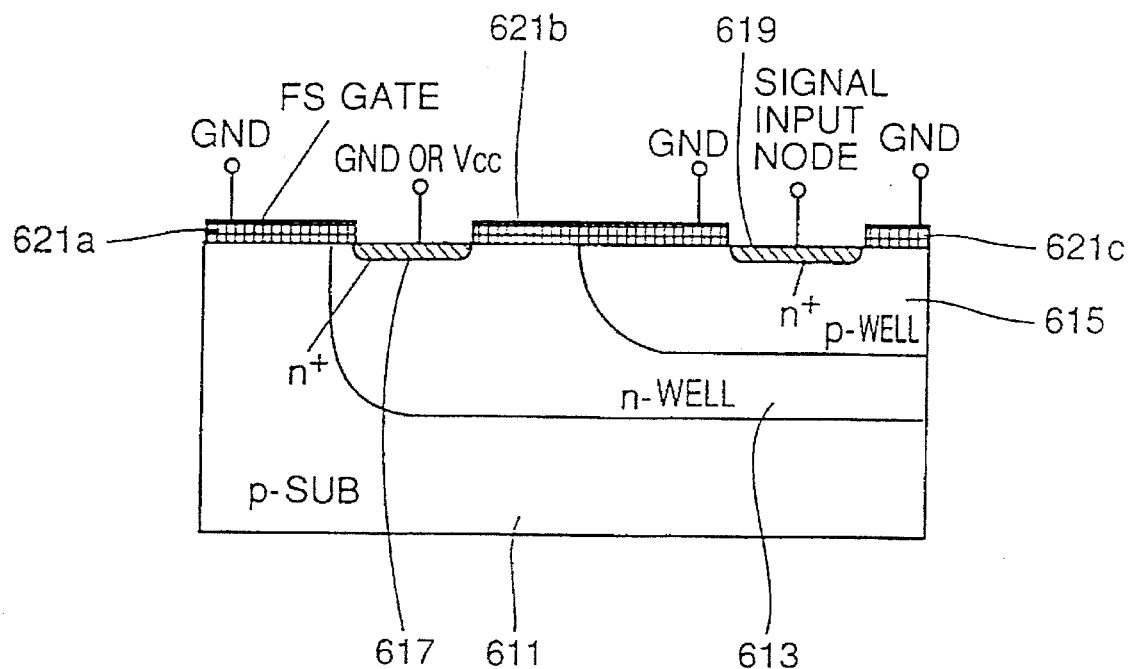

The semiconductor memory device shown in FIG. 35 is for improving the ability of the above described input protecting circuit. Referring to FIG. 35, an $n^+$ type impurity region 617 and an $n^+$ type impurity region 619 as a signal input node are formed in the main surface of a semiconductor substrate 611. The $n^+$ type impurity region 619 is formed in a predetermined region of the main surface of a p type well region 615 formed in a predetermined region of the main surface of semiconductor substrate 611. Further, an n type well region 613 is formed on the main surface of semiconductor substrate 611 so as to cover p type well region 615. In a predetermined region of the main surface of n type well region 613, $n^+$ type impurity region 617 is formed. FS element isolation films 621a, 621b, and 621c are formed in predetermined regions on the main surface of semiconductor substrate 611 and the main surfaces of n type well region 613 and p type well region 615.

Ground potential GND is applied to FS element isolation films 621a, 621b, and 621c. Therefore, semiconductor substrate 611 and p type well region 615 are electrically isolated effectively as in the case of the above described sixteenth embodiment.

Therefore, the input protecting circuit shown in FIG. 35 is formed by an npn junction transistor from an input node 619 to n type well region 613 through p type well region 615. The structure of the input protecting circuit can be simplified by the present embodiment.

[Twenty-First Embodiment]

Figure 36:
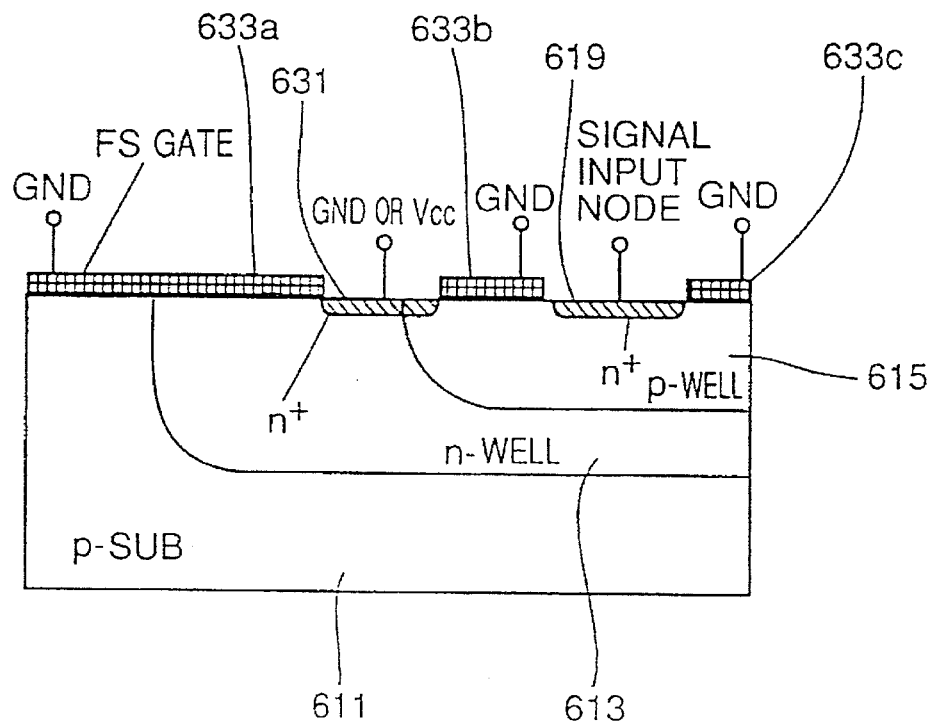

The semiconductor memory device of FIG. 36 is for improving the ability of the above described input protecting circuit.

Referring to FIG. 36, $n^+$ type impurity region 631 and $n^+$ type impurity region 619 as a signal input node are formed in the main surface of semiconductor substrate 611. The $n^+$ type impurity region 619 is formed in a predetermined region of the main surface of p type well region 615 formed in a predetermined region of the main surface of semiconductor substrate 611. Further, n type well region 613 is formed on the main surface of semiconductor substrate 611 so as to cover p type well region 615. At a boundary portion between n type well region 613 and p type well region 615, $n^+$ type impurity region 631 is formed. FS element isolation films 633a, 633b, and 633c are formed in predetermined regions of the main surface of semiconductor substrate 611, n type well region 613, and p type well region 615.

Ground potential GND is applied to FS element isolation films 633a, 633b, and 633c.

Therefore, semiconductor substrate 611 and p type well region 615 are electrically isolated effectively as in the case of the above described sixteenth embodiment.

As a result, the input protecting circuit shown in FIG. 36 is formed by an npn junction transistor from input node 619 to n type well region 613 through p type well region 615. The structure of the input protecting circuit can be simplified by the present embodiment.

Further, $n^+$ type impurity region 631 for fixing the potential of the n type well region is formed so as to extend to p type well region 615. Therefore, such a structure is formed easily as improving the characteristics of the input protecting circuit by increasing the current driving capability when the npn junction transistor is turned on.

[Twenty-Second Embodiment]

Figure 37:
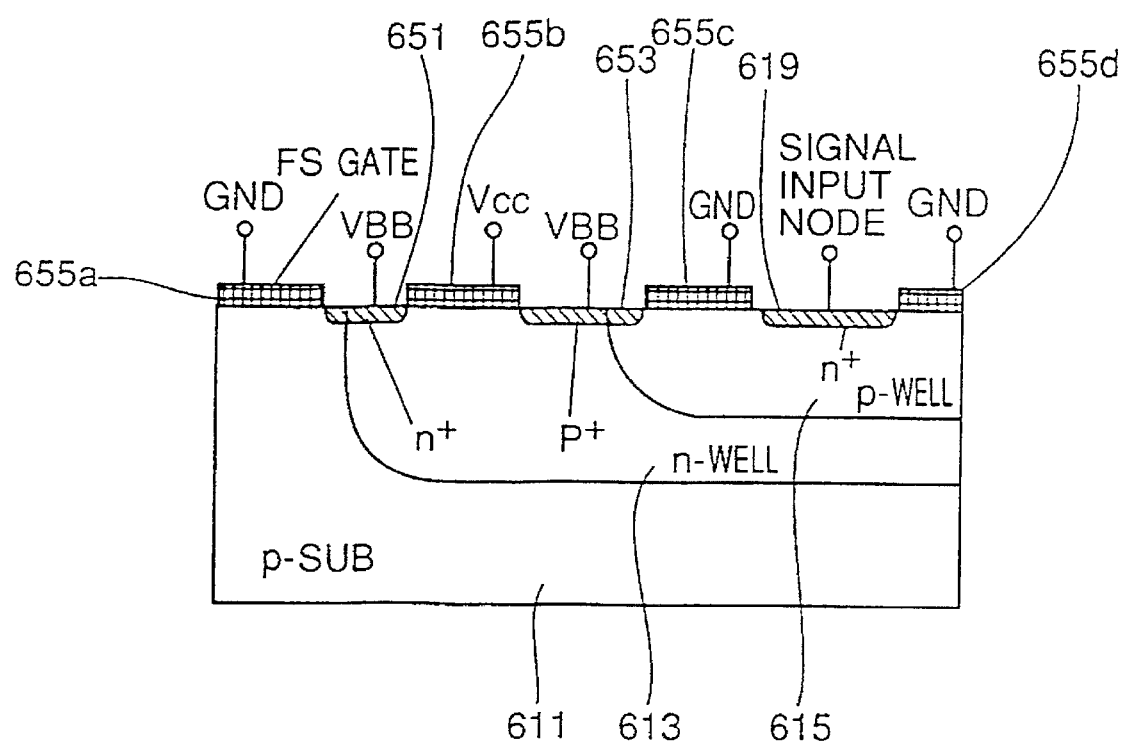

The semiconductor memory device of FIG. 37 is for improving the ability of the above described input protecting circuit.

Referring to FIG. 37, an $n^+$ type impurity region 651, a $p^+$ type impurity region 653, and $n^+$ type impurity region 619 as a signal input node are formed in the main surface of semiconductor substrate 611. The $n^+$ type impurity region 619 is formed in a predetermined region of the main surface of p type well region 615 formed in a predetermined region of the main surface of semiconductor substrate 611. Further, n type well region 613 is formed on the main surface of semiconductor substrate 611 so as to cover p type well region 615. At a boundary portion between n type well region 613 and p type well region 615, $p^+$ type impurity region 653 is formed. Further, $n^+$ type impurity region 651 for potential fixation is formed in a predetermined region of the main surface of n type well region 613 separately from $p^+$ type impurity region 653. FS element isolation films 655a, 655b, 655c, and 655d are formed in predetermined regions of the main surface of semiconductor substrate 611, n type well region 613, and p type well region 615.

Ground potential GND, power supply potential Vcc, and ground potential GND are applied to FS element isolation films 655a, 655b, and 655c and 655d, respectively. Therefore, semiconductor substrate 611 and p type well region 615 can be electrically isolated effectively as in the case of the above described sixteenth embodiment.

As a result, the input protecting circuit shown in FIG. 37 is formed by an npn junction transistor from input node 619 to n type well region 613 through p type well region 615. The structure of the input protecting circuit can be simplified by the present embodiment.

Further, $p^+$ type impurity region 653 for fixing the potential of the n type well region is formed so as to extend to p type well region 615. Therefore, such a structure is formed easily as improving the characteristics of the input protecting circuit by increasing the current driving capability when the npn junction transistor is turned on.

[Twenty-Third Embodiment]

Figure 38:
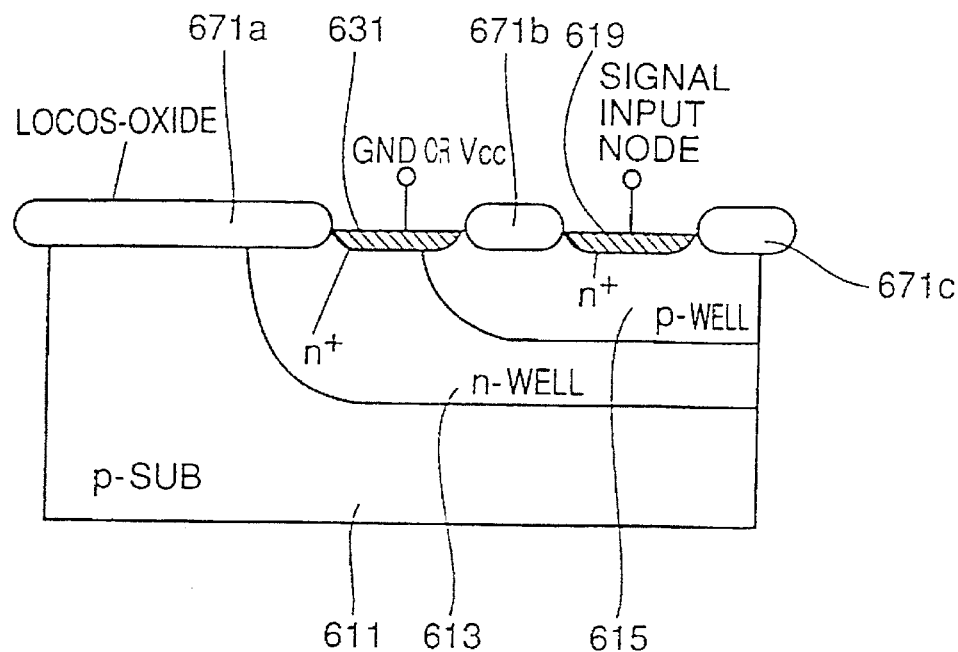

The semiconductor memory device of FIG. 38 is for improving the ability of the above described input protecting circuit. Referring to FIG. 38, $n^+$ type impurity region 631 and $n^+$ type impurity region 619 as a signal input node are formed in the main surface of semiconductor substrate 611. The $n^+$ type impurity region 619 is formed in a predetermined region of the main surface of p type well region 615 formed in a predetermined region of the main surface of semiconductor substrate 611. Further, n type well region 613 is formed on the main surface of semiconductor substrate 611 so as to cover p type well region 615. At a boundary portion between n type well region 613 and p type well region 615, $n^+$ type impurity region 631 is formed. Silicon oxide films 671a, 671b, and 671c are formed as element isolation films in predetermined regions of the main surface of semiconductor substrate 611, n type well region 613, and p type well region 615 by an oxidation method.

According to the present embodiment, the input protecting circuit shown in FIG. 36 can be formed with the conventionally used oxidation.

Therefore, semiconductor substrate 611 and p type well region 615 can be electrically isolated as in the case of the above described sixteenth embodiment.

As a result, the input protecting circuit shown in FIG. 38 is formed by an npn junction transistor from input node 619 to n type well region 613 through p type well region 615. The structure of the input protecting circuit can be simplified by the present embodiment.

Further, $n^+$ type impurity region 631 for fixing the potential of the n type well region is formed so as to extend to p type well region 615. Therefore, such a structure is formed easily as improving the characteristics of the input protecting circuit by increasing the current driving capability when the npn junction transistor is turned on.

[Twenty-Fourth Embodiment]

Figure 39:
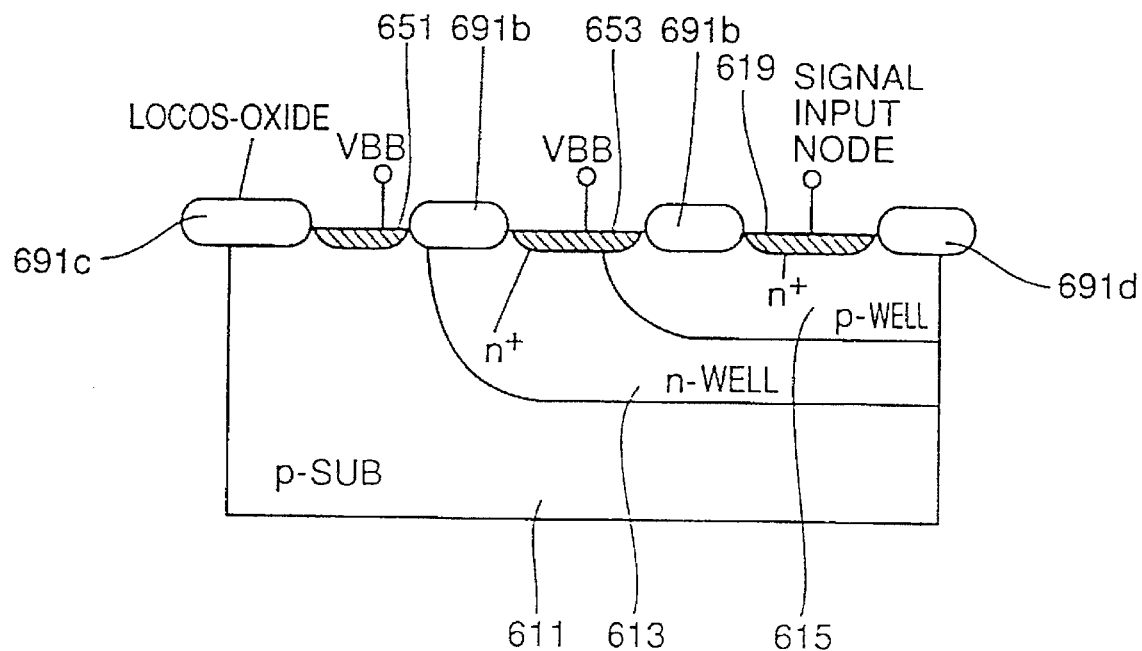

The semiconductor memory device of FIG. 39 is for improving the ability of the above described input protecting circuit. Referring to FIG. 39, $n^+$ type impurity region 651, $p^+$ type impurity region 653, and $n^+$ type impurity region 619 as a signal input node are formed in the main surface of semiconductor substrate 611. The $n^+$ type impurity region 619 is formed in a predetermined region of the main surface of p type well region 615 formed in a predetermined region of the main surface of semiconductor substrate 611. Further, n type well region 613 is formed on the main surface of semiconductor substrate 611 so as to cover p type well region 615. At a boundary portion between n type well region 613 and p type well region 615, $p^+$ type impurity region 653 is formed. Further, $n^+$ type impurity region 651 for potential fixation is formed in a predetermined region of the main surface of n type well region 613 separately from $p^+$ type impurity region 653. Silicon oxide films 691a, 691b, 691c, and 691d are formed as element isolation films in predetermined regions of the main surface of semiconductor substrate 611, n type well region 613, and p type well region 615 by an oxidation method.

According to the present embodiment, the input protecting circuit shown in FIG. 37 can be formed by the conventionally used oxidation method.

Therefore, semiconductor substrate 611 and p type well region 615 can be electrically isolated as in the case of the above described sixteenth embodiment.

As a result, the input protecting circuit shown in FIG. 39 is formed by an npn junction transistor from input node 619 to n type well region 613 through p type well region 615. The structure of the input protecting circuit can be simplified by the present embodiment.

Further, $p^+$ type impurity region 653 for fixing the potential of the n type well region is formed so as to extend to p type well region 615. Therefore, such a structure is formed easily as improving the characteristics of the input protecting circuit by increasing the current driving capability when the npn junction transistor is turned on.

[Twenty-Fifth Embodiment]

Figure 40:
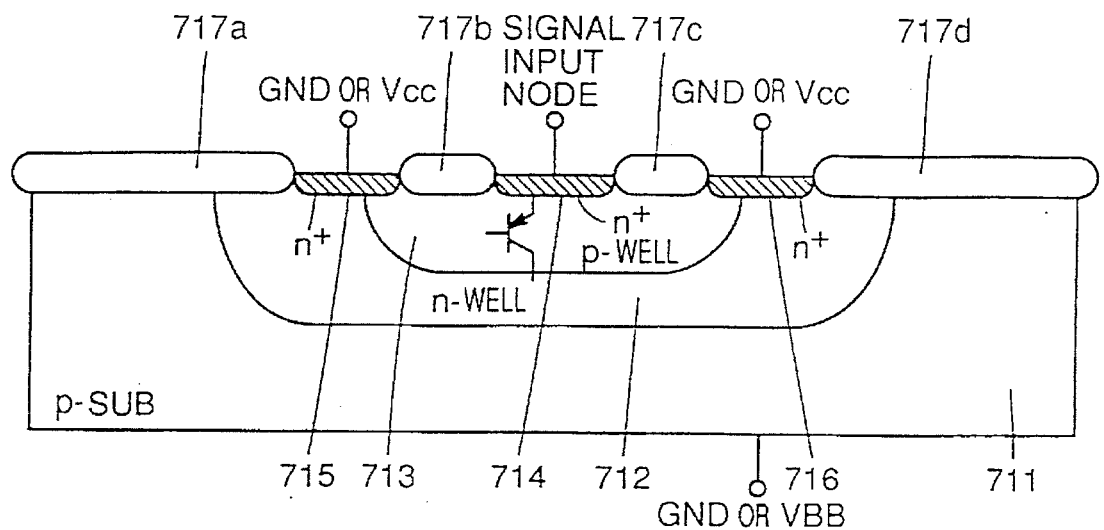
FIG. 40 is a sectional view showing a conventional input protecting circuit corresponding to a twenty-fifth embodiment of the present invention.

The present embodiment relates to a protecting circuit against transient application of a high external surge voltage to a signal input terminal of a semiconductor integrated circuit. FIG. 40 is a sectional view showing a structure of an input protecting circuit portion of a DRAM having a conventional triple well structure used for describing the present embodiment. Referring to FIG. 40, in the conventional structure, an $n^+$ type impurity region 714 as a signal input node and $n^+$ type impurity regions 715 and 716 are formed with a predetermined space in the main surface of a p type semiconductor substrate 711. LOCOS oxide films 717a, 717b, 717c, and 717d are formed so as to electrically isolate $n^+$ type impurity regions 714, 715, and 716. A p well region 713 is formed so as to cover $n^+$ type impurity region 714 constituting a signal input node. An $n^-$ well region 712 is formed so as to cover $p^-$ well region 713. Ground potential GND or power supply potential Vcc is applied to $n^+$ type impurity regions 715 and 716. In the conventional structure of the input protecting circuit portion shown in FIG. 40, when a surge voltage is applied from the signal input node, a large current flows in the substrate direction in a contact portion from an input node metal interconnection (not shown) to $n^+$ type impurity region 714. This large current destroys a pn junction between $n^+$ type impurity region 714 and $p^-$ type well region 713 under the contact portion. As a result, a leakage path to the substrate is formed, making the device defective.

Figure 41:
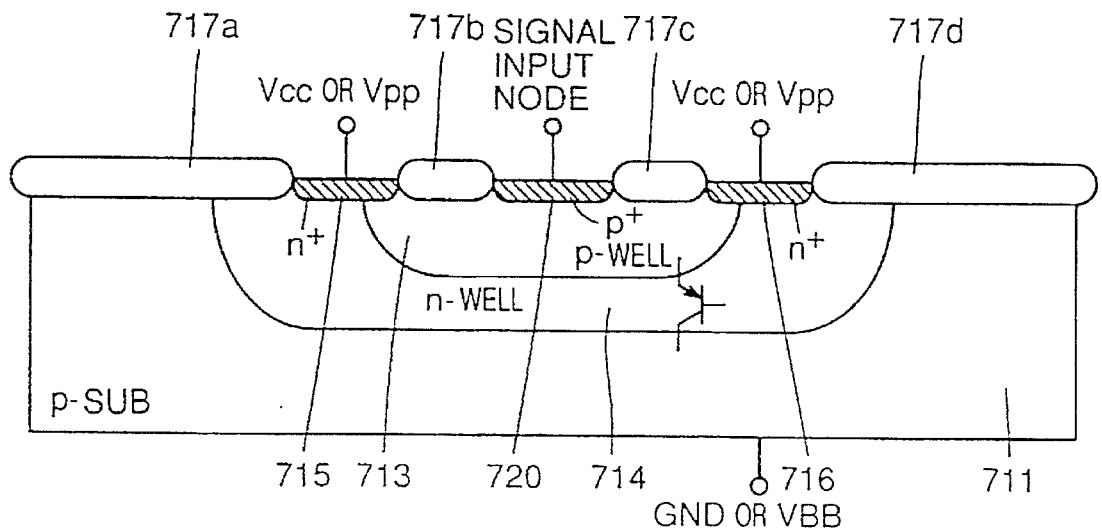
FIGS. 41 to 44 are sectional views showing input protecting circuits of semiconductor memory devices according to twenty-fifth to twenty-eighth embodiments of the present invention.

In the twenty-fifth embodiment, the signal input node is formed by a $p^+$ type impurity region 720, and $p^-$ type well region 713 of the same conductivity type is formed so as to cover $p^+$ type impurity region 720, as shown in FIG. 41. Further, $n^-$ type well region 714 is formed so as to cover $p^-$ type well region 713. As described above, in the twenty-fifth embodiment, the depth of the pn junction is increased by forming deeper $p^-$ type well region 713 under $p^+$ type impurity region 720. As a result, formation of a leakage path to the substrate by destruction of the pn junction is prevented, even if a large current flows in the substrate direction from the signal input node upon application of the surge voltage to the signal input node ($p^+$ type impurity region 720). Further, since $p^-$ type impurity region 713 is formed so as to have a lower impurity concentration than $p^+$ type impurity region 720, the impurity distribution gradient is gentle at a junction portion between $p^-$ type well region 713 and $n^-$ type well region 714. Destruction of the pn junction under the contact portion is prevented also by this structure, even if a large current flows in the substrate direction from the signal input node.

Further, as shown in FIG. 41, a bipolar transistor having a p well—n well—p substrate structure can be formed in the twenty-fifth embodiment. By this transistor being turned on at the time of application of the surge voltage, resistance to the surge voltage is improved. As a result, destruction of the pn junction under the contact portion is effectively prevented even if a large current flows in the substrate direction from the input node contact portion.

In the case of the twenty-fifth embodiment shown in FIG. 41, a voltage to be applied to $n^-$ well region 714 is set as follows according to the signal input level. When a signal at the GND to Vcc level is applied to the signal input node, a voltage at the Vcc level is applied to $n^-$ type well region 714 through $n^+$ type impurity region 715. When a signal at the Vcc level or more is applied to the signal input node, a voltage at the Vpp level which is at least at the Vcc level is applied to $n^-$ type well region 714 through $n^+$ type impurity regions 715 and 716.

[Twenty-Sixth Embodiment]

Figure 42:
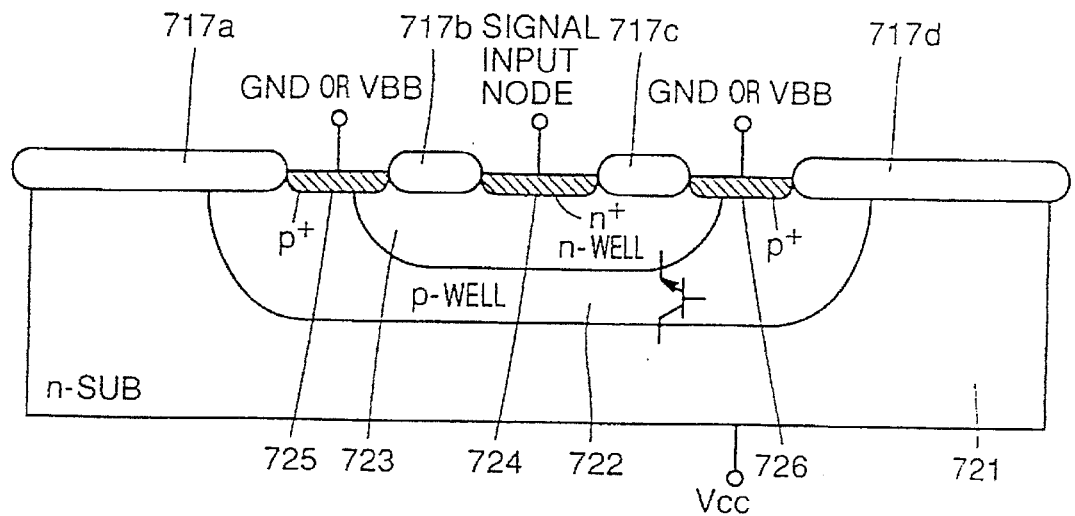

Contrary to the above described twenty-fifth embodiment, the signal input node is formed by an $n^+$ type impurity region 724, an $n^-$ type region 723 is formed so as to cover $n^+$ type impurity region 724, and a $p^-$ type well region 722 is further formed so as to cover $n^-$ type well region 723, in the twenty-sixth embodiment shown in FIG. 42. By forming $n^-$ type well region 723 under $n^+$ type impurity region 724 constituting a signal input node contact portion at a deeper position and at a lower impurity concentration than $n^+$ type impurity region 724, formation of a leakage path to the substrate by destruction of the pn junction is prevented, even if a large current flows in the substrate direction from $n^+$ type impurity region 724 upon application of a surge voltage to the signal input node. Further, as shown in FIG. 42, a bipolar transistor having an n well—p well—n substrate structure can be formed. By this transistor being turned on in response to application of the surge voltage, resistance to the surge voltage can be improved.

In the twenty-sixth embodiment, when a signal at the GND to Vcc level is applied to the signal input node, a voltage at the GND level is applied to $p^-$ type well region 722 through $p^+$ type impurity region 725 or 726. When a signal at the GND level or less is applied to the signal input node, VBB which is a potential at the GND level or less is applied to $p^-$ type well region 722 through $p^+$ type impurity region 725 or 726.

[Twenty-Seventh Embodiment]

Figure 43:
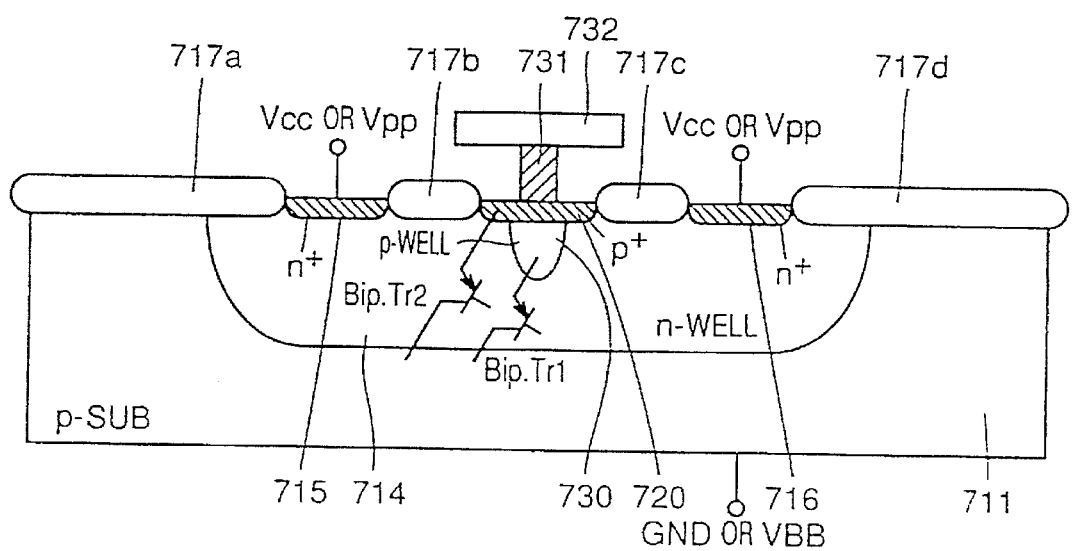

In the twenty-seventh embodiment, a signal input node is formed by $p^+$ type impurity region 720, and a $p^-$ type well region 730 is formed so as to cover part of $p^+$ type impurity region 720, as shown in FIG. 43. An interconnection 731 for electrical connection with an interconnection layer 732 is in contact with the surface of $p^+$ type impurity region 720. The $p^-$ type well region 730 is formed so as to cover at least the bottom of $p^+$ type impurity region 720 positioned under a connection portion between interconnection 731 and $p^+$ type impurity region 720. The $n^-$ type well region 714 is formed so as to cover $p^+$ type impurity region 720 and $p^-$ type well region 730.

In the structure of the present embodiment, $p^-$ type well region 730 is formed under $p^+$ type impurity region 720 so as to have a larger depth and a lower impurity concentration than $p^+$ type impurity region 720. By forming $p^-$ type well region 730 as described above, formation of a leakage path to the substrate by destruction of the junction under $p^+$ type impurity region 720 can be prevented, even if a large current flows in the substrate direction from $p^+$ type impurity region 720 upon application of the surge voltage to $p^+$ type impurity region 720.

Unlike in the above described twenty-fifth embodiment, $p^-$ type well region 730 is formed not over the entire $p^+$ type impurity region 720 but only under the contact portion of $p^+$ type impurity region 720, in the twenty-seventh embodiment. By this structure, in addition to a bipolar transistor (Bip. Tr1) having a p well—n well—p substrate structure, another bipolar transistor (Bip. Tr2) having a $p^+$ impurity region—n well—p substrate structure can also be formed. This Bip. Tr2 increases the current amplification efficiency. More specifically, this transistor (Bip. Tr2) is turned on in response to application of the surge voltage to cause a larger current flow, whereby resistance to the surge voltage is further improved.

[Twenty-Eighth Embodiment]

Figure 44:
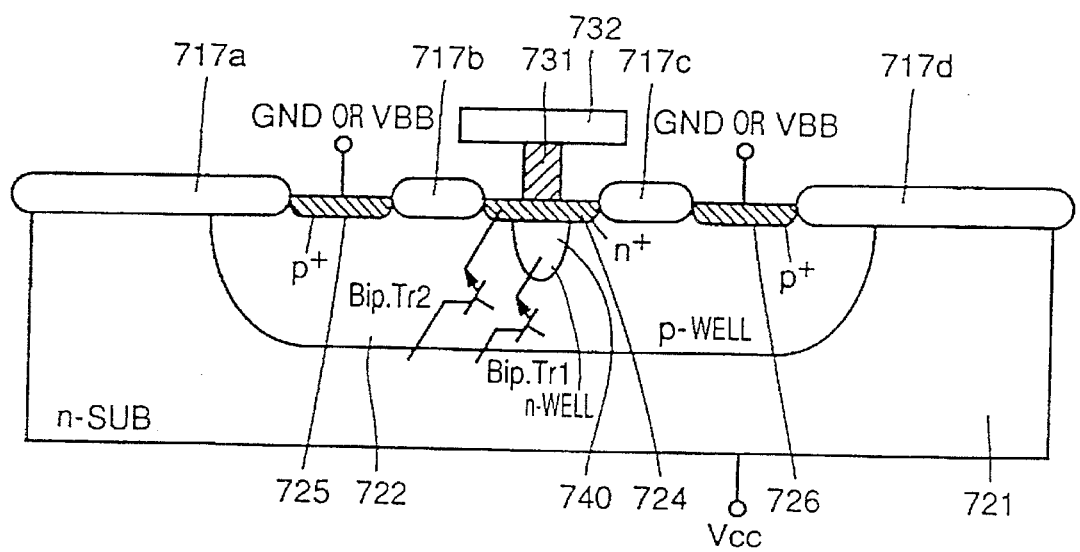

In the twenty-eighth embodiment, a signal input node is formed of $n^+$ type impurity region 724, and an $n^-$ type well region 740 is formed so as to cover part of $n^+$ type impurity region 724, as shown in FIG. 44. Further, $p^-$ type well region 722 is formed so as to cover $n^+$ type impurity region 724 and $n^-$ type well region 740. By forming $n^-$ type well region 740 at least under the contact portion of $n^+$ type impurity region 724 at a deeper position and at a lower impurity concentration than $n^+$ type impurity region 724 as described above, formation of a leakage path to the substrate by destruction of the junction under the contact portion is prevented, even if a large current flows in the substrate direction from the contact portion upon application of the surge voltage to the contact portion. Further, in the twenty-eighth embodiment, $n^-$ type well region 740 is formed not over the entire $n^+$ type impurity region 724 but only under the contact portion of $n^+$ type impurity region 724, as in the case of the above described twenty-seventh embodiment. Therefore, not only a bipolar transistor (Bip. Tr1) having an n well—p well—n substrate structure but also a bipolar transistor (Bip. Tr2) having an $n^+$ type impurity region—p well—n substrate structure can also be formed. This transistor Bip. Tr2 increases the current amplification efficiency. More specifically, this transistor Bip. Tr2 is also turned on in response to application of the surge voltage to cause a larger current flow, whereby resistance to the surge voltage is further improved.

[Twenty-Ninth Embodiment]

In the twenty-ninth embodiment, an example is shown using a trench isolation method isolating elements by trench isolation regions 750a, 750b, 750c, and 750d. Since $p^-$ type well region 713 is formed so as to cover $n^+$ type impurity region 714 in the conventional structure shown in FIG. 40, the base portion of the bipolar transistor is formed of $p^-$ well region 713. In this case, when LOCOS oxide films 717a to 717d shown in FIG. 40 are replaced by trench isolation regions 750a to 750d shown in FIG. 45, the base portion in the lateral direction of $p^-$ type well region 713 constituting the base portion in the structure shown in FIG. 40 is decreased by the trench isolation regions. As a result, the current driving capability is decreased, and the surge absorbing ability is weakened. In the twenty-ninth embodiment shown in FIG. 45, $p^-$ type well region 713 is formed so as to cover $p^+$ type impurity region 720, and $n^-$ type well region 714 is formed so as to cover $p^-$ type well region 713. Therefore, the base region of the bipolar transistor is formed of $n^-$ type well region 714. Further, since the pn junction is formed at a boundary between $p^-$ type well region 713 and $n^-$ type well region 714, the pn junction is deeper than the conventional case.

As a result, the pn junction of the vertical bipolar transistor is less likely to be destroyed, as compared to the conventional case. In other words, the ability of the protecting circuit of the vertical bipolar transistor is increased, and therefore, the conventional problem does not occur even if the current driving capability of the lateral bipolar transistor is decreased by the function of the trench isolation regions. Further, since $p^-$ type well region 713 is formed so as to have a lower impurity concentration than $p^+$ type impurity region 720, the impurity concentration gradient becomes gentle at the pn junction portion between $p^-$ type well region 713 and $n^-$ type well region 714. This also prevents destruction of the pn junction, and the ability of the protecting circuit of the vertical bipolar transistor is increased, as compared to the structure shown in FIG. 40. Note that similar effects can be obtained in the structure shown in FIGS. 41 to 44 by using trench isolation regions 750a to 750d shown in FIG. 45 instead of isolation by LOCOS oxide films 717a to 717d.

Figure 45:
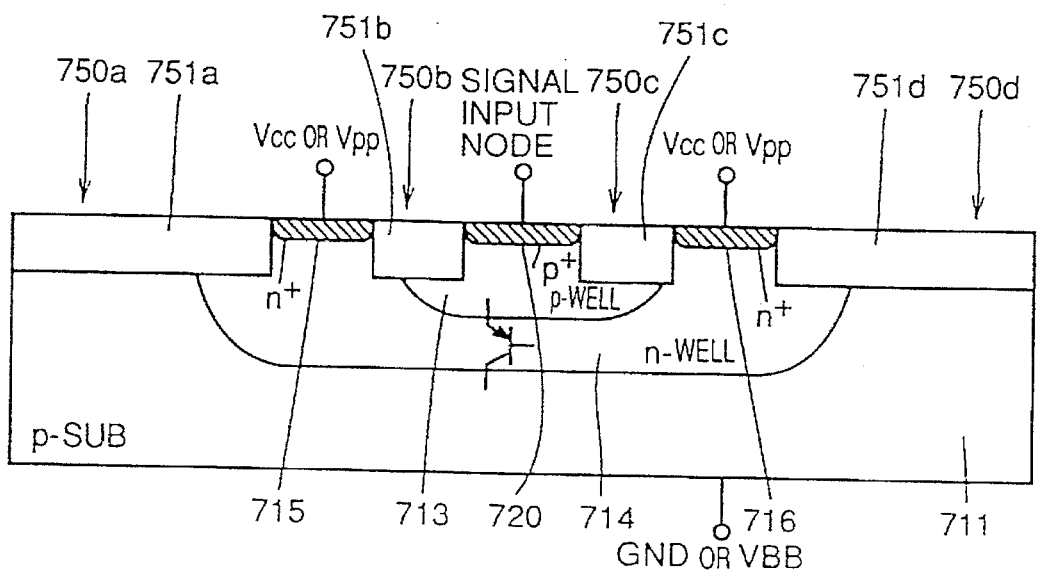
FIGS. 45 and 46 are sectional views showing an input protecting circuit of a semiconductor memory device according to a twenty-ninth embodiment of the present invention.

In the structure shown in FIG. 45, trench isolation regions 750a to 750d are formed of $SiO_2$ films 751a to 751d. In order to form isolation regions 750a to 750d of $SiO_2$ films 751a to 751d as described above, etching is first carried out for forming a trench. After depositing the $SiO_2$ film by a CVD method or the like, the surface is etched away. As a result, such a structure as shown in FIG. 45 is obtained.

Figure 46:
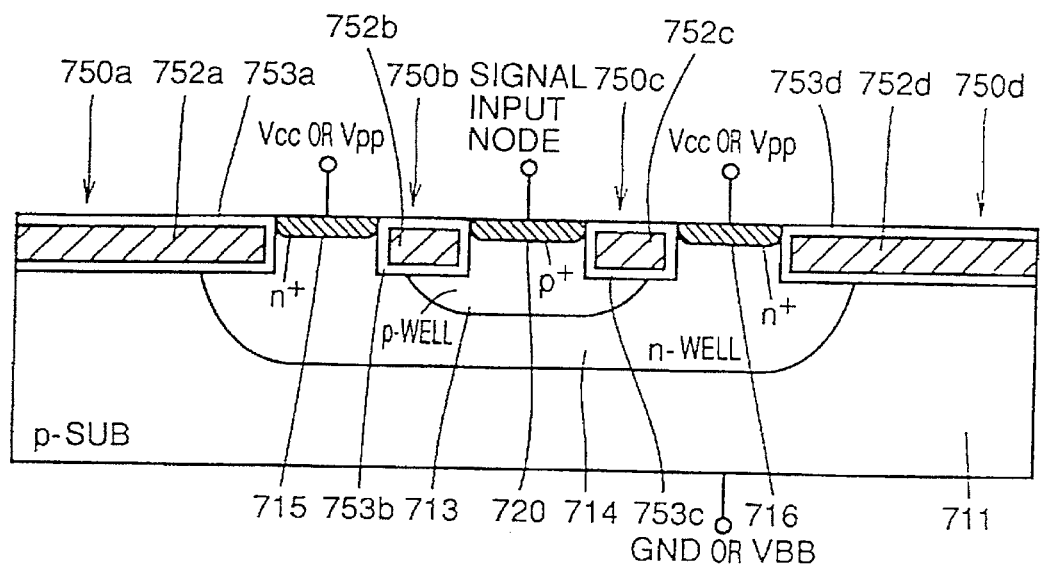

An example is shown in FIG. 46 in which trench isolation regions 750a and 750d are formed of polysilicon films 752a to 752d and $SiO_2$ films 753a to 753d, respectively, in the structure shown in FIG. 45. In order to manufacture trench isolation regions 750a to 750d shown in FIG. 46, etching is first carried out to form a trench. By thermally oxidizing the wall face of the trench, $SiO_2$ films 753a to 753d are formed at the bottom surface and the side surfaces of the trench. After depositing polysilicon films 752a to 752d using the CVD method or the like, the surface is etched away. Further, $SiO_2$ film 753a is formed on polysilicon film 752a using the CVD method or the like. Trench isolation regions 750a to 750d as shown in FIG. 46 are thus obtained. In the following embodiments, the trench isolation region may employ either structure shown in FIG. 45 or 46.

[Thirtieth Embodiment]

Figure 47:
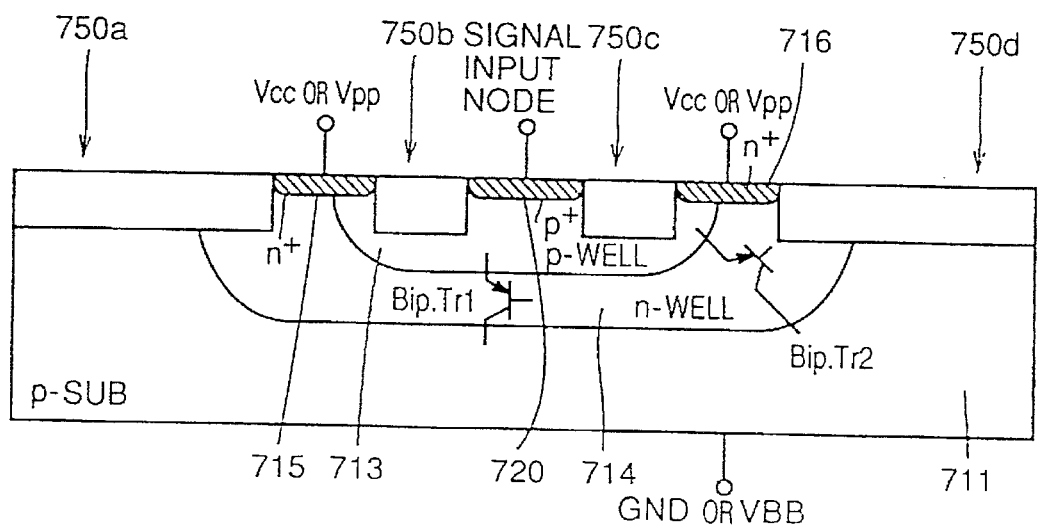
FIGS. 47 to 49 are sectional views showing input protecting circuits of semiconductor memory devices according to thirtieth to thirty-second embodiments of the present invention.

In the thirtieth embodiment, $p^-$ type well region 713 is formed so as to cover not only $p^+$ type impurity region 720 but also trench isolation regions 750b and 750c, as shown in FIG. 47. By this structure, not only the vertical bipolar transistor (Bip. Tr1) but also the lateral bipolar transistor (Bip. Tr2) can function as the protecting circuit. Accordingly, the characteristics of the input protecting circuit can be further improved.

[Thirty-First Embodiment]

Figure 48:
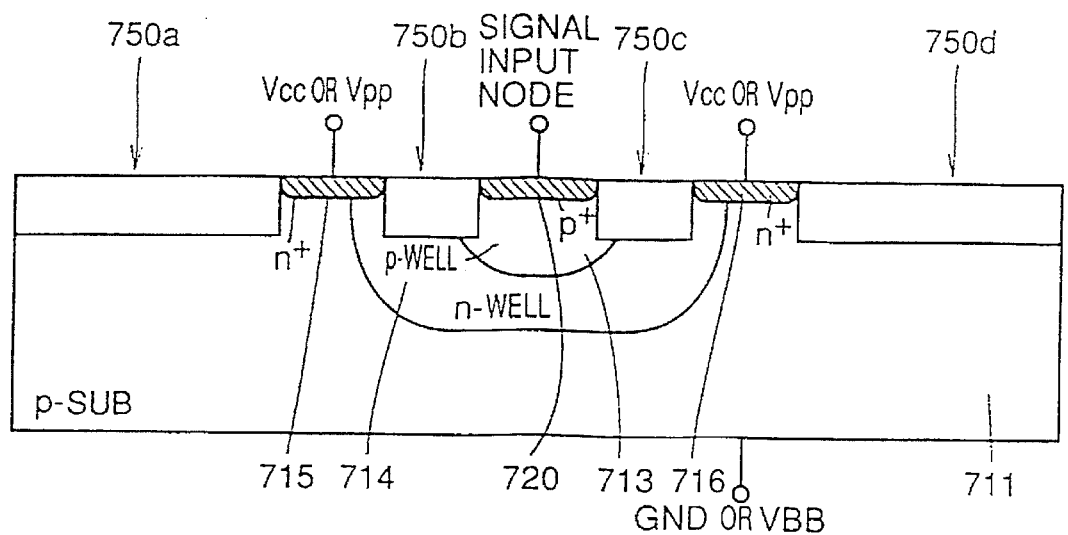

The thirty-first embodiment shown in FIG. 48 is different from the above described twenty-ninth embodiment in that the side end portions of $n^-$ type well region 714 cross the center portions of $n^+$ type impurity regions 715 and 716. More specifically, while the side end portions of $n^-$ type well region 714 are formed so as to cover the lower surfaces of trench isolation regions 750a and 750d in the structure of the twenty-ninth embodiment shown in FIG. 45, the side end portions of $n^-$ type well region 714 are formed so as to cover only part of $n^+$ type impurity regions 715 and 716 in the thirty-first embodiment shown in FIG. 48. By such a structure, the similar effects to those of the above described twenty-ninth embodiment can be obtained.

[Thirty-Second Embodiment]

Figure 49:
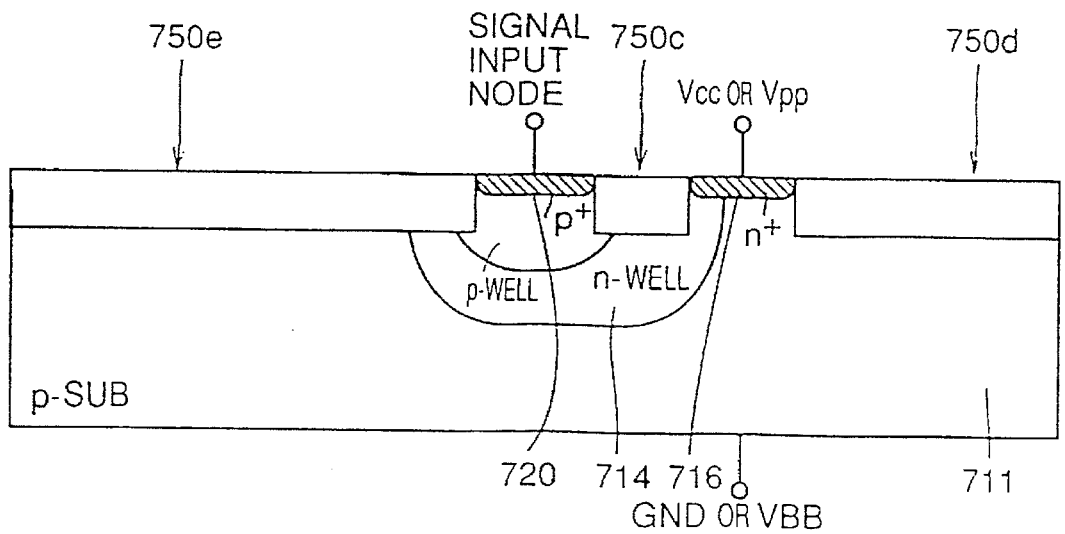

In the thirty-second embodiment, $n^+$ type impurity region 716 constituting a Vcc (or Vpp) node is formed only on one side, as shown in FIG. 49. Therefore, unlike in the structure of the thirty-first embodiment shown in FIG. 48, a laterally long trench isolation region 750e is formed. By this structure, the similar effects to those of the above described embodiment can be obtained. Further, the ability of the protecting circuit can be more improved as compared to the conventional case.

Figure 50:
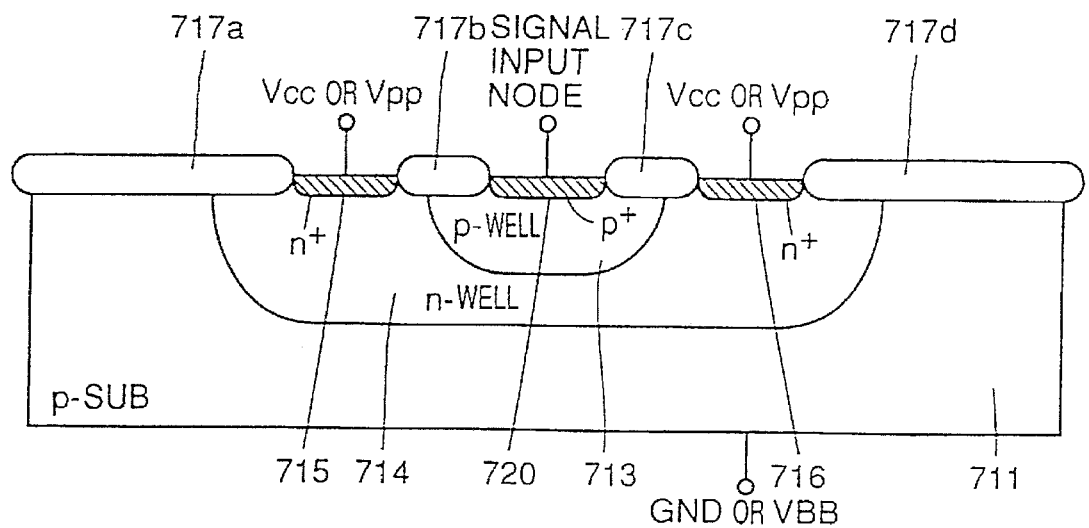
FIG. 50 is a sectional view showing a modification of the semiconductor memory device according to the twenty-ninth embodiment shown in FIGS. 45 and 46.
Figure 51:
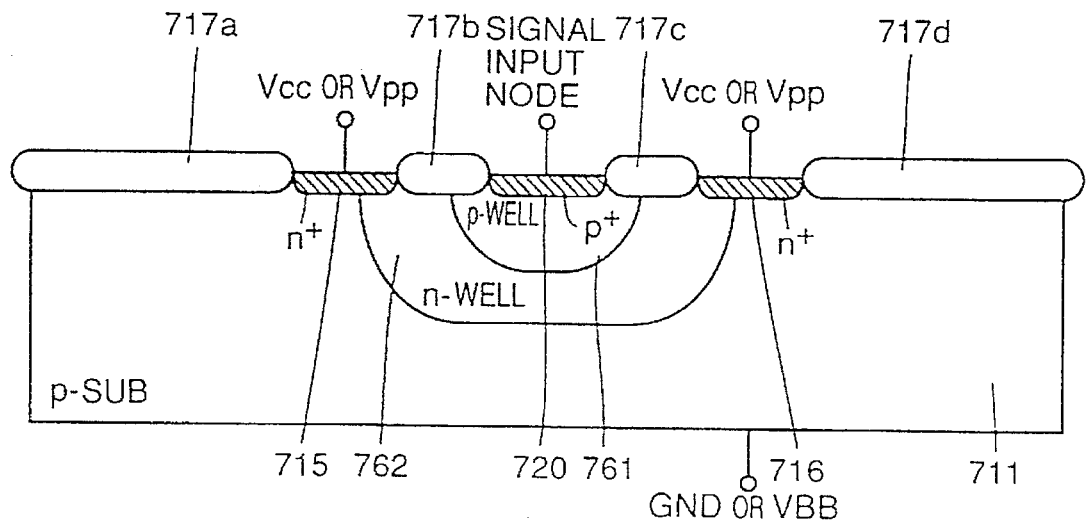
FIGS. 51 and 52 are sectional views showing modifications of semiconductor memory devices according to the thirty-first and thirty-second embodiments shown in FIGS. 48 and 49, respectively.
Figure 52:
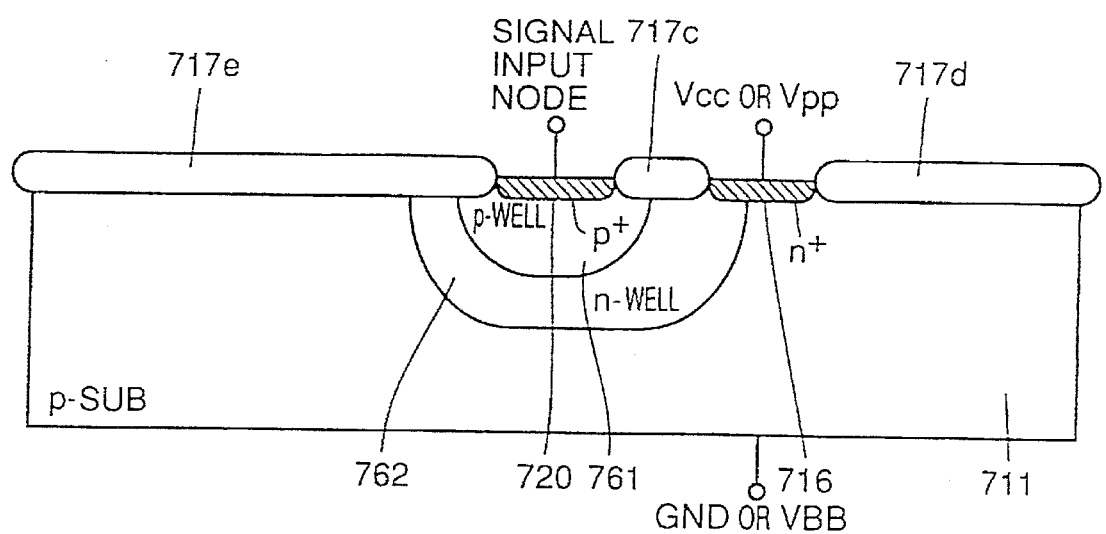
Figure 53:
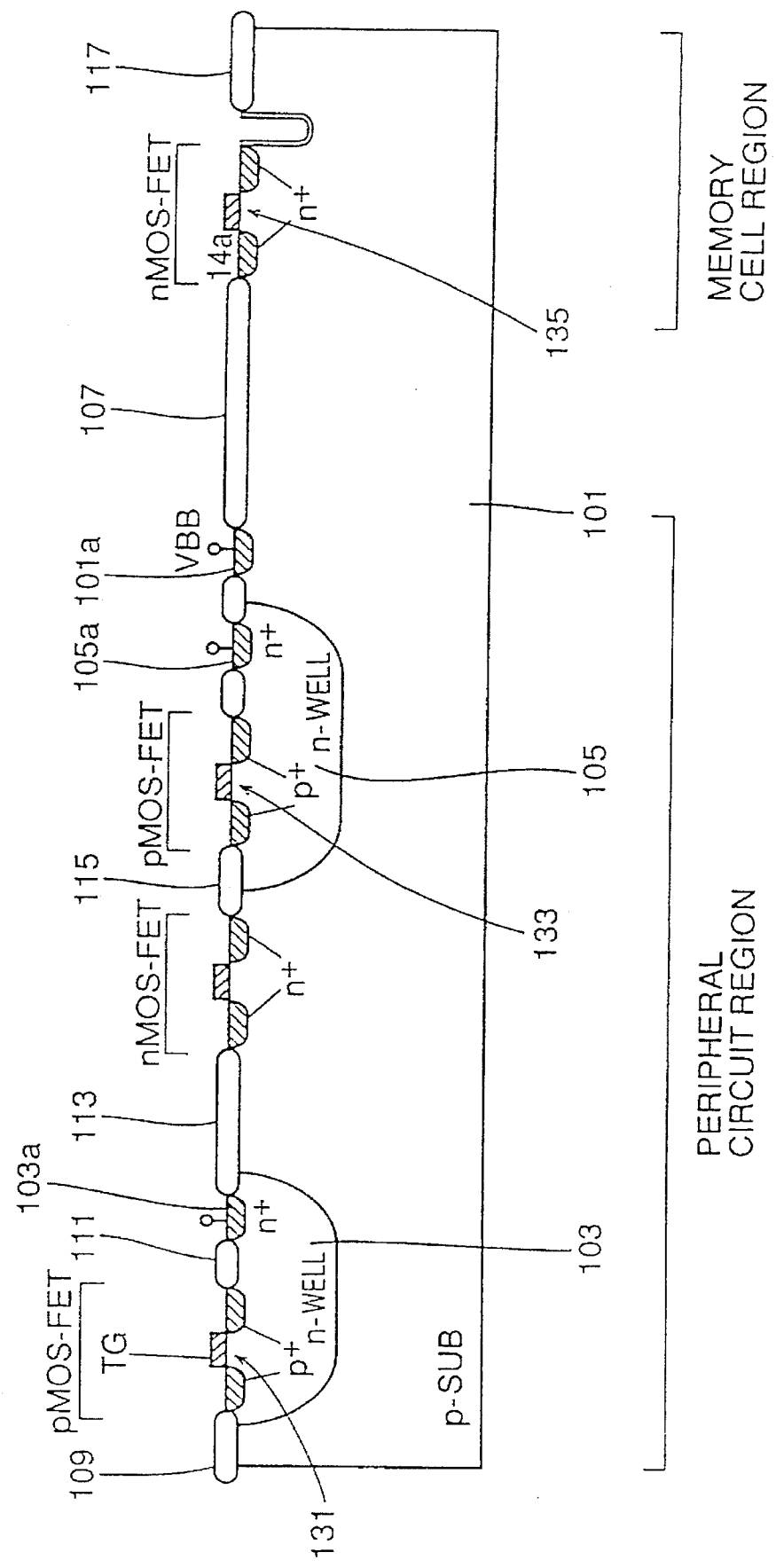
FIG. 53 is a sectional view showing a conventional semiconductor memory device.
Figure 54:
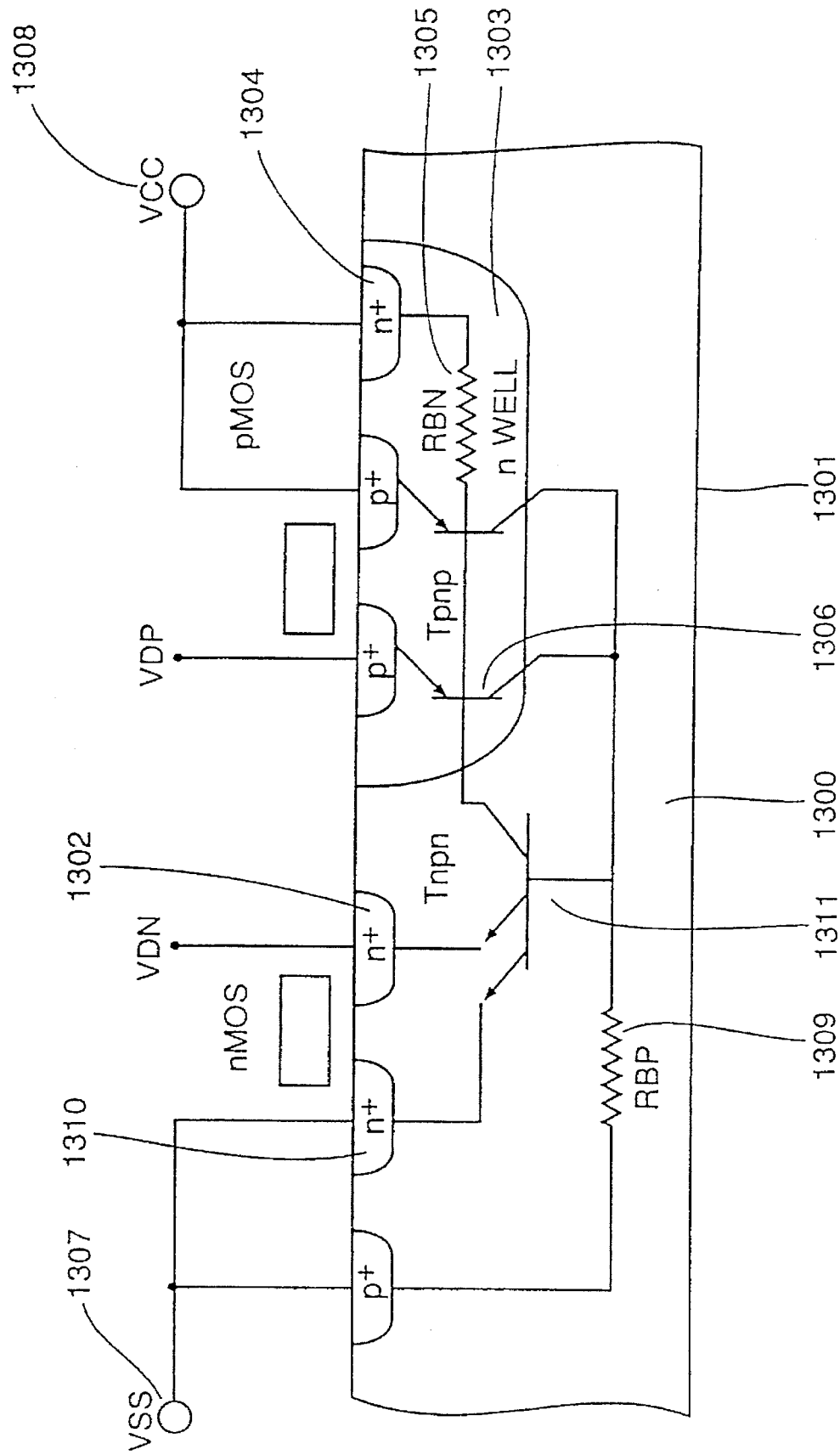
FIG. 54 is a sectional view for describing a parasitic thyristor structure of a bulk CMOS.
Figure 55:
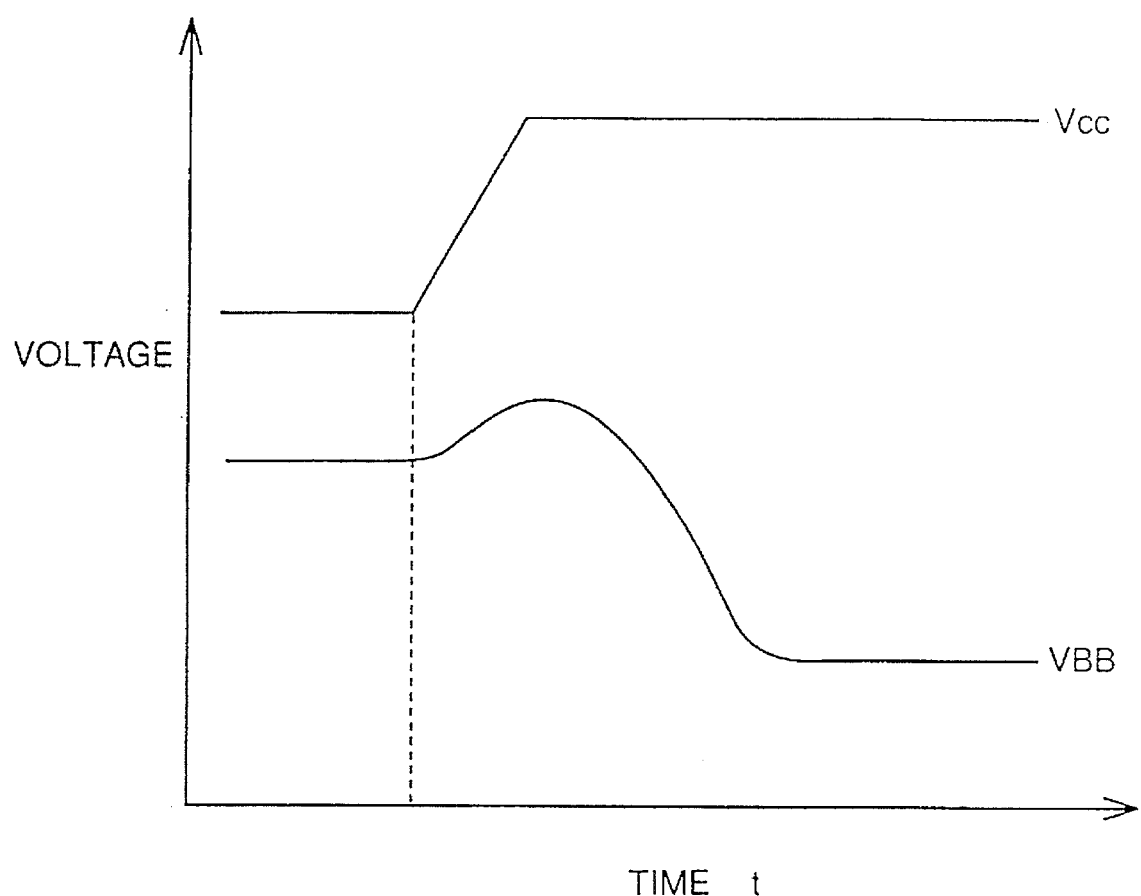
FIG. 55 is a diagram showing change of a substrate potential.

FIG. 50 shows a modification in which trench isolation regions 750a to 750d are replaced by LOCOS oxide films 717a to 717d in the structure of the twenty-ninth embodiment shown in FIGS. 45 and 46. FIG. 51 shows a modification in which trench isolation regions 750a to 750d are replaced by LOCOS oxide films 717a to 717d in the structure of the thirty-first embodiment shown in FIG. 48. FIG. 52 shows a modification in which trench isolation regions 750d and 750e are replaced by LOCOS oxide films 717d and 717e in the thirty-second embodiment shown in FIG. 49. The similar effects can be obtained by changing the isolation regions from the trench isolation regions to the LOCOS oxide films.

In the semiconductor memory device according to the one aspect of the present invention, a ground potential which is stable even at the time of power-on or the like is applied to a semiconductor region in the peripheral circuit region. Therefore, latch up can be prevented, and reliability of the semiconductor memory device can be increased.

In the semiconductor memory device according to the another aspect of the present invention, well regions constituting a parasitic transistor causing latch up are formed separately with a predetermined space. Therefore, the parasitic transistor is less likely to be formed. As a result, latch up can be prevented, and reliability of the semiconductor memory device can be increased.

In the semiconductor memory device, according to the still another aspect of the present invention, a controllable and stable internal power supply is connected to the semiconductor region of the peripheral circuit region. Therefore, latch up can be prevented, and reliability of the semiconductor memory device can be increased.

In the semiconductor memory device according to the further aspect of the present invention, a large part of electric charge generated by α particles does not reach the source/drain region associated with storage. Therefore, the soft error caused by the α panicles can be substantially reduced.

In the semiconductor memory device according to the further aspect of the present invention, element isolation films are provided in predetermined regions on the main surface of the semiconductor substrate and the well region. Since the respective well regions and the well regions and the semiconductor substrate can be electrically isolated with ease and reliability, the structure of the semiconductor memory device can be simplified.

In the semiconductor memory device according to the further aspect of the present invention, element isolation films are provided in predetermined regions on the main surface of the semiconductor substrate and the well region. Since the input protecting circuit is structured simply and improved in performance, the structure of the semiconductor memory device can be simplified, and its performance can be improved.

In the semiconductor memory device according to the further aspect of the present invention, a first well region of a first conductivity type is formed so as to be electrically connected to a first impurity region of the first conductivity type formed in the main surface of the semiconductor substrate and to have a larger depth than the first impurity region. A second well region of a second conductivity type is formed so as to cover the first well region. Since a pn junction is positioned between the deep first well region and second well region, the pn junction is less likely to be destroyed as compared to the conventional case, when a large current flows in the substrate direction from a contact portion. As a result, formation of a leakage path to the substrate by destruction of the junction under the contact portion can be prevented effectively. Further, a bipolar transistor of a first well—second well—semiconductor substrate structure can be formed, and by this transistor being turned on in response to application of a surge voltage, resistance to the surge voltage can be improved. When the first well region is formed so as to have a lower impurity concentration than the first impurity region, the impurity distribution gradient becomes gentle at a junction portion between the first well region and the second well region. As a result, the junction is less likely to be destroyed even if a large current flows. If the first well region is formed so as to cover the bottom surface and both side surfaces of an element isolation region having a trench isolation structure, a lateral bipolar transistor can also function as a protecting circuit. As a result, the characteristics of the input protecting circuit can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device including a memory cell region and a peripheral circuit region, wherein
   said memory cell region includes a first well region of a first conductivity type and a memory cell field effect transistor of a second conductivity type formed in a surface of said first well region,
   said peripheral circuit region includes a second well region of the second conductivity type, a semiconductor region of the first conductivity type, and a complementary type field effect transistor constituted of a first field effect transistor of the first conductivity type formed in a surface of said second well region and a second field effect transistor of the second conductivity type formed in a surface of said semiconductor region, and
   a substrate potential generated within the semiconductor memory device applied to said first well region of said memory cell region, and a ground potential applied to said semiconductor region of said peripheral circuit region.

2. The semiconductor memory device according to claim 1, wherein
   said semiconductor region includes a semiconductor substrate of the first conductivity type, and
   said second well region of said peripheral circuit region is formed so as to extend to said memory cell region and to cover said first well region of said memory cell region.

3. The semiconductor memory device according to claim 1, wherein
   said semiconductor region of said peripheral circuit region includes a third well region of the first conductivity type, and
   said second well region is formed so as to cover said third well region and to extend to said memory cell region to cover said first well region of said memory cell region.

4. A semiconductor memory device including a memory cell region and a peripheral circuit region on a semiconductor substrate of a first conductivity type having a main surface, wherein
   said memory cell region includes a first well region of the first conductivity type formed on the main surface of said semiconductor substrate and a memory cell field effect transistor of a second conductivity type formed in a surface of said first well region,
   said peripheral circuit region includes a second well region of the second conductivity type formed in the main surface of said semiconductor substrate, a third well region of the first conductivity type formed in the main surface of said semiconductor substrate, a fourth well region of the second conductivity type formed so as to cover said third well region, and a complementary type field effect transistor constituted of a first field effect transistor of the first conductivity type formed in a surface of said second well region and a second field effect transistor of the second conductivity type formed in a surface of said third well region, and
   said second well region of the second conductivity type and said fourth well region of the second conductivity type are formed with a predetermined space so as to be isolated by said semiconductor substrate of the first conductivity type.

5. A semiconductor memory device including a memory cell region and a peripheral circuit region on a semiconductor substrate of a first conductivity type having a main surface, wherein
   said memory cell region includes a first well region of the first conductivity type formed on the main surface of said semiconductor substrate and a memory cell field effect transistor of a second conductivity type formed in a surface of said first well region,
   said peripheral circuit region includes a second well region of the second conductivity type formed in the main surface of said semiconductor substrate, and a complementary type field effect transistor constituted of a first field effect transistor of the first conductivity type formed in a surface of said second well region and a second field effect transistor of the second conductivity type formed in the main surface of said semiconductor substrate, and
   said second well region of the second conductivity type of said peripheral circuit region having a second source/drain region of the first conductivity type formed in the surface thereof is connected to a power supply within the semiconductor memory device having a voltage obtained by decreasing a voltage of a power supply external to the semiconductor memory device by the power supply generating means within the semiconductor memory device.

6. The semiconductor memory device according to claim 4, wherein said peripheral circuit region includes an input protecting circuit having a source/drain region of the second conductivity type, and said source/drain region of the second conductivity type is formed in a semiconductor region of the first conductivity type connected to a substrate potential generated by internal circuitry.

7. The semiconductor memory device according to claim 5, wherein said peripheral circuit region includes an input protecting circuit having a source/drain region of the second conductivity type, and said source/drain region of the second conductivity type is formed in a semiconductor region of the first conductivity type connected to a substrate potential generated by internal circuitry.

8. A semiconductor memory device, comprising:

a semiconductor substrate having a main surface;

a first well region of a first conductivity type formed in a predetermined region of the main surface of said semiconductor substrate with a first depth from the main surface of said semiconductor substrate;

a second well region of a second conductivity type formed in a predetermined region of a main surface of said first well region with a second depth from the main surface of said first well region;

a pair of first source/drain regions of first conductivity type formed with a predetermined space so as to sandwich a first channel region in a predetermined region of a main surface of said second well region with a predetermined depth from the main surface of said second well region;

a first gate electrode formed on said first channel region with a first gate insulating film therebetween;

a pair of second source/drain regions of the first conductivity type formed with a predetermined space so as to sandwich a second channel region in a predetermined region of the main surface of said semiconductor substrate with a predetermined depth from the main surface of said semiconductor substrate;

a second gate electrode formed on said second channel region with a second gate insulating film therebetween; and an element isolation film formed on the main surface of said semiconductor substrate, said first well region, and said second well region positioned between said first source/drain regions and said second source/drain regions.

9. A semiconductor memory device, comprising:

a semiconductor substrate having a main surface;

a first well region of a second conductivity type formed in a predetermined region of the main surface of said semiconductor substrate;

a second well region of a first conductivity type formed in the main surface of the semiconductor substrate within said first well region;

an element isolation film formed on the main surface of said semiconductor substrate, said first well region, and said second well region and having first and second openings on said first and second well regions, respectively;

a first conductive region formed in the surface of said first well region positioned at said first opening; and a second conductive region formed in a surface of said second well region positioned at said second opening.

10. A semiconductor device including an input protecting circuit, wherein said input protecting circuit includes a semiconductor substrate of a first conductivity type having a main surface, a first impurity region of the first conductivity type formed in the main surface of said semiconductor substrate, a first well region of the first conductivity type formed in the main surface of said semiconductor substrate so as to be electrically connected to said first impurity region and to have a depth larger than said first impurity region, and a second well region of a second conductivity type formed in the main surface of said semiconductor substrate so as to cover said first well region.

11. The semiconductor memory device according to claim 10, wherein said first well region has an impurity concentration lower than said first impurity region.

12. The semiconductor memory device according to claim 10, wherein said first well region is formed so as to cover said first impurity region.

13. The semiconductor memory device according to claim 10, wherein said first well region is formed so as to cover only part of said first impurity region.

14. The semiconductor memory device according to claim 10, wherein at least any of first and second power supply potentials externally applied to said semiconductor device is applied to said second well region.

15. The semiconductor memory device according to claim 10, wherein at least any of a potential higher than a higher one of first and second power supply potentials externally applied to said semiconductor device and a potential lower than a lower one of said first and second power supply potentials externally applied to said semiconductor device is applied to said second well region.

16. The semiconductor memory device according to claim 10, wherein said first impurity region constitutes an input node for a signal generated external to the semiconductor memory device, an input node for power supply external to the semiconductor memory device, or an output node for a signal generated external to the semiconductor memory device.

* * * * *